(12) United States Patent
Watanabe et al.

(10) Patent No.: US 11,162,772 B2
(45) Date of Patent: Nov. 2, 2021

(54) MAGNETIC SENSOR DEVICE

(71) Applicants: TDK CORPORATION, Tokyo (JP); ASAHI KASEI MICRODEVICES CORPORATION, Tokyo (JP)

(72) Inventors: Kazuya Watanabe, Tokyo (JP); Hiraku Hirabayashi, Tokyo (JP); Yoshitaka Okutsu, Tokyo (JP); Masanori Yoshida, Tokyo (JP)

(73) Assignees: TDK CORPORATION, Tokyo (JP); ASAHI KASEI MICRODEVICES CORPORATION, Tokyo (JP)

( * ) Notice: Subject to any disclaimer, the term of this patent is extended or adjusted under 35 U.S.C. 154(b) by 80 days.

(21) Appl. No.: 16/699,781

(22) Filed: Dec. 2, 2019

(65) Prior Publication Data

US 2020/0191547 A1 Jun. 18, 2020

(30) Foreign Application Priority Data

Dec. 12, 2018 (JP) .............................. JP2018-232084

(51) Int. Cl.
*G01B 7/00* (2006.01)
*G01R 33/00* (2006.01)
*G01R 33/09* (2006.01)

(52) U.S. Cl.
CPC ......... *G01B 7/003* (2013.01); *G01R 33/0029* (2013.01); *G01R 33/0082* (2013.01); *G01R 33/098* (2013.01)

(58) Field of Classification Search
None
See application file for complete search history.

(56) References Cited

U.S. PATENT DOCUMENTS 9,116,195 B2   8/2015  Yamashita et al.
2003/0094944 A1*  5/2003  Suzuki ................ G01R 33/093
                                                            324/252

FOREIGN PATENT DOCUMENTS

JP   2015-075465 A   4/2015
JP   2016-138839 A   8/2016

* cited by examiner

*Primary Examiner* — Jas A Sanghera
(74) *Attorney, Agent, or Firm* — Oliff PLC

(57) ABSTRACT

A magnetic sensor device includes a composite chip component, and a sensor chip mounted on the composite chip component. The sensor chip includes a first magnetic sensor, a second magnetic sensor, and a third magnetic sensor that detect components of an external magnetic field that are in directions parallel to an X direction, parallel to a Y direction, and parallel to a Z direction, respectively. The composite chip component includes a first magnetic field generator, a second magnetic field generator, and a third magnetic field generator for generating additional magnetic field components that are in directions parallel to the X direction, parallel to the Y direction, and parallel to the Z direction, respectively.

18 Claims, 27 Drawing Sheets

MAGNETIC SENSOR DEVICE

BACKGROUND OF THE INVENTION

1. Field of the Invention

The present invention relates to a magnetic sensor device including a magnetic sensor for detecting a component in a predetermined direction of an external magnetic field and a magnetic field generator for generating a magnetic field different from the external magnetic field.

2. Description of the Related Art

Magnetic sensors for detecting a component in a predetermined direction of an external magnetic field have recently been used in a variety of applications. Hereinafter, a component of an external magnetic field will be referred to as an external magnetic field component. A type of magnetic sensor is known that incorporates at least one magnetic detection element provided on a substrate. An example of the magnetic detection element is a magnetoresistive element.

The magnetic sensor for detecting an external magnetic field component in a predetermined direction is configured to generate a detection signal corresponding to the external magnetic field component in the predetermined direction. The predetermined direction will hereinafter be referred to as a main-axis direction. For example, the main-axis direction coincides with a sensing direction of the magnetic sensor. The ratio of a change in the detection signal of the magnetic sensor to a change in the strength of a magnetic field in the main-axis direction will be referred to as a main-axis sensitivity of the magnetic sensor.

The main-axis sensitivity can vary due to individual differences of magnetic sensors. In a device including a plurality of magnetic sensors for detecting external magnetic field components in a plurality of directions, the respective main-axis sensitivities of the magnetic sensors may be different from each other. The main-axis sensitivity can also vary depending on the environment of use of the magnetic sensor. A device including a magnetic sensor is therefore desirably capable of measuring the main-axis sensitivity of the magnetic sensor and correcting the detection signal of the magnetic sensor on the basis of the measurement results according to need.

U.S. Pat. No. 9,116,195 B2 discloses a magnetic sensor including a semiconductor substrate provided with a plurality of magnetosensitive elements spaced from each other, and a magnetic substance provided on the semiconductor substrate. The plurality of magnetosensitive elements are placed at edge areas of the magnetic substance. The magnetic sensor detects magnetic-field strengths for three mutually orthogonal axes on the basis of outputs of the plurality of magnetosensitive elements. In this magnetic sensor, each magnetosensitive element has magnetic sensitivity in the vertical direction. This magnetic sensor includes a horizontal magnetic field generating coil for sensitivity measurement, and a plurality of vertical magnetic field generating coils for sensitivity measurement. The horizontal magnetic field generating coil generates a horizontal magnetic field component. The horizontal magnetic field component causes vertical magnetic field components to occur near the edge of the magnetic substance, and the plurality of magnetosensitive elements detect those vertical magnetic field components to thereby detect the horizontal magnetic field component. The plurality of vertical magnetic field generating coils are provided near the plurality of magnetosensitive elements and generate vertical magnetic field components. The plurality of magnetosensitive elements respectively detect the vertical magnetic field components generated by the plurality of vertical magnetic field generating coils.

The magnetic sensor disclosed in U.S. Pat. No. 9,116,195 B2 is capable of measuring main-axis sensitivities for the three axes.

In a device including a plurality of magnetic sensors for detecting external magnetic field components in a plurality of directions, the plurality of magnetic sensors can be in the form of chip components and mounted on a support such as a substrate. Here, a coordinate system that is set with reference to the support will be referred to as a reference coordinate system, and coordinate systems that are set with reference to the magnetic sensors will be referred to as sensor coordinate systems. Even if the device including a plurality of magnetic sensors is designed so that the sensor coordinate systems of the plurality of magnetic sensors coincide with the reference coordinate system, the sensor coordinate systems can deviate from the reference coordinate system due to misalignment of the magnetic sensors with the support.

The sensor coordinate systems of the plurality of magnetic sensors can also deviate from each other due to misalignment between the plurality of magnetic sensors.

In such cases, the detection signal of each magnetic sensor can change in response to a change in the strength of a magnetic field in a direction other than the main-axis direction. Hereinafter, the ratio of a change in the detection signal of the magnetic sensor to a change in the strength of the magnetic field in a direction other than the main-axis direction will be referred to as a cross-axis sensitivity.

The device including a plurality of magnetic sensors is therefore desirably capable of measuring not only the main-axis sensitivity but also the cross-axis sensitivities of each magnetic sensor and correcting the detection signals of the plurality of magnetic sensors on the basis of the measurement results according to need.

JP 2015-075465A describes a three-dimensional magnetic field measurement device including a magnetic body, first to fourth magnetic detection elements arranged near the magnetic body, a signal processing unit, a correction-coefficient storage unit, and a magnetic-field-component calculation unit. Based on the output signals of the first to fourth magnetic detection elements, the signal processing unit generates output signals corresponding to three-dimensional magnetic field vectors input to the magnetic body. The correction-coefficient storage unit stores correction coefficients for correcting cross-axis sensitivity components contained in the output signals of the signal processing unit. The magnetic-field-component calculation unit generates three-dimensional output signals based on the output signals of the signal processing unit and the correction coefficients.

JP 2015-075465A further describes a correction-coefficient generation device for generating the correction coefficients. The correction-coefficient generation device is provided outside the three-dimensional magnetic field measurement device. To generate the correction coefficients, the correction-coefficient generation device inputs three linearly independent magnetic field vectors to the three-dimensional magnetic field measurement device.

According to the three-dimensional magnetic field measurement device described in JP 2015-075465A, the correction-coefficient generation device is provided outside the three-dimensional magnetic field measurement device. Such a three-dimensional magnetic field measurement device has the following problems. First, any means for inputting the three linearly independent magnetic field vectors to the three-dimensional magnetic field measurement device must be precisely aligned with the three-dimensional magnetic field measurement device. Second, depending on the environment of use of the three-dimensional magnetic field measurement device, it may be difficult to input the three linearly independent magnetic field vectors to the three-dimensional magnetic field measurement device using the correction-coefficient generation device.

SUMMARY OF THE INVENTION

It is an object of the present invention to provide a magnetic sensor device including a magnetic sensor, the magnetic sensor device being capable of precisely measuring the main- and cross-axis sensitivities of the magnetic sensor.

A magnetic sensor device of the present invention includes: a first magnetic sensor for detecting a first external magnetic field component, the first external magnetic field component being a component of an external magnetic field and being in a first sensing direction; a support; a first magnetic field generator capable of generating a first additional magnetic field; and a second magnetic field generator capable of generating a second additional magnetic field. The first magnetic sensor, the support, the first magnetic field generator, and the second magnetic field generator are integrated. The support has an outer surface including a reference plane. The first magnetic sensor is mounted on the reference plane.

The first magnetic sensor is configured to be subjected to: a first additional magnetic field component when the first additional magnetic field is generated by the first magnetic field generator; and a second additional magnetic field component when the second additional magnetic field is generated by the second magnetic field generator. The first additional magnetic field component is a component of the first additional magnetic field and is in a direction parallel to a first direction. The second additional magnetic field component is a component of the second additional magnetic field and is in a direction parallel to a second direction. The first direction and the second direction are mutually different directions in the reference plane.

In the magnetic sensor device of the present invention, the first and second magnetic field generators may be included in the support.

In the magnetic sensor device of the present invention, the first sensing direction may be parallel to the reference plane.

In the magnetic sensor device of the present invention, the first magnetic field generator may include a first coil and a second coil located at mutually different positions, and the second magnetic field generator may include a third coil and a fourth coil located at mutually different positions.

The magnetic sensor device of the present invention may further include a second magnetic sensor for detecting a second external magnetic field component, the second external magnetic field component being a component of the external magnetic field and being in a second sensing direction. The second magnetic sensor is mounted on the reference plane. The second magnetic sensor is configured to be subjected to the first additional magnetic field component when the first additional magnetic field is generated by the first magnetic field generator, and to the second additional magnetic field component when the second additional magnetic field is generated by the second magnetic field generator.

When the magnetic sensor device includes the second magnetic sensor, both the first sensing direction and the second sensing direction may be parallel to the reference plane. The first magnetic field generator may include a first coil and a second coil located at mutually difference positions. The second magnetic field generator may include a third coil and a fourth coil located at mutually different positions.

When the magnetic sensor device includes the second magnetic sensor, the magnetic sensor device may further include a third magnetic sensor for detecting a third external magnetic field component, the third external magnetic field component being a component of the external magnetic field and being in a third sensing direction. The third magnetic sensor is mounted on the reference plane. The third magnetic sensor is configured to be subjected to the first additional magnetic field component when the first additional magnetic field is generated by the first magnetic field generator, and to the second additional magnetic field component when the second additional magnetic field is generated by the second magnetic field generator.

When the magnetic sensor device of the present invention includes the third magnetic sensor, both the first sensing direction and the second sensing direction may be parallel to the reference plane. The third sensing direction may be perpendicular to the reference plane.

When the magnetic sensor device of the present invention includes the third magnetic sensor, the first magnetic field generator may include a first coil and a second coil located at mutually difference positions, and the second magnetic field generator may include a third coil and a fourth coil located at mutually different positions. In such a case, the first to fourth coils may be capable of generating a third additional magnetic field in cooperation with each other. The third magnetic sensor is configured to be subjected to a third additional magnetic field component when the third additional magnetic field is generated by the first to fourth coils. The third additional magnetic field component is a component of the third additional magnetic field and is in a direction parallel to a third direction. The third direction is perpendicular to the reference plane.

When the magnetic sensor device of the present invention includes the third magnetic sensor, the magnetic sensor device may further include a third magnetic field generator that is integrated with the support and capable of generating a third additional magnetic field. In such a case, the third magnetic sensor is configured to be subjected to a third additional magnetic field component when the third additional magnetic field is generated by the third magnetic field generator. The third additional magnetic field component is a component of the third additional magnetic field and is in a direction parallel to a third direction. The third direction is perpendicular to the reference plane. The third magnetic field generator may be included in the support. The first and second magnetic sensors may each be configured to be subjected to the third additional magnetic field component when the third additional magnetic field is generated by the third magnetic field generator.

When the magnetic sensor device of the present invention includes the third magnetic sensor, the reference plane may include a first area, a second area, and a third area different from each other. The first area is an area formed by vertically projecting the first magnetic sensor onto the reference plane. The second area is an area formed by vertically projecting the second magnetic sensor onto the reference plane. The third area is an area formed by vertically projecting the third magnetic sensor onto the reference plane. At least part of the first area may be located to be intersected by a first straight line, and at least part of the second area may be located to be intersected by a second straight line, the first straight line and the second straight line being two mutually orthogonal straight lines that pass through the centroid of the third area and are perpendicular to the third direction. No portion of the first area may be intersected by the second straight line. No portion of the second area may be intersected by the first straight line. The first area may include a first partial area and a second partial area located on opposite sides of the third area in a direction parallel to the first straight line. The second area may include a third partial area and a fourth partial area located on opposite sides of the third area in a direction parallel to the second straight line.

In the magnetic sensor device of the present invention, the support and the first and second magnetic field generators are integrated. This makes it possible to precisely measure the main- and cross-axis sensitivities of the first magnetic sensor using the first and second magnetic field generators.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. First, reference is made to FIG. 1 to describe a schematic configuration of a magnetic sensor device according to a first embodiment of the invention. The magnetic sensor device 1 according to the present embodiment is a device for detecting components of an external magnetic field that are in three mutually orthogonal directions.

Figure 1:
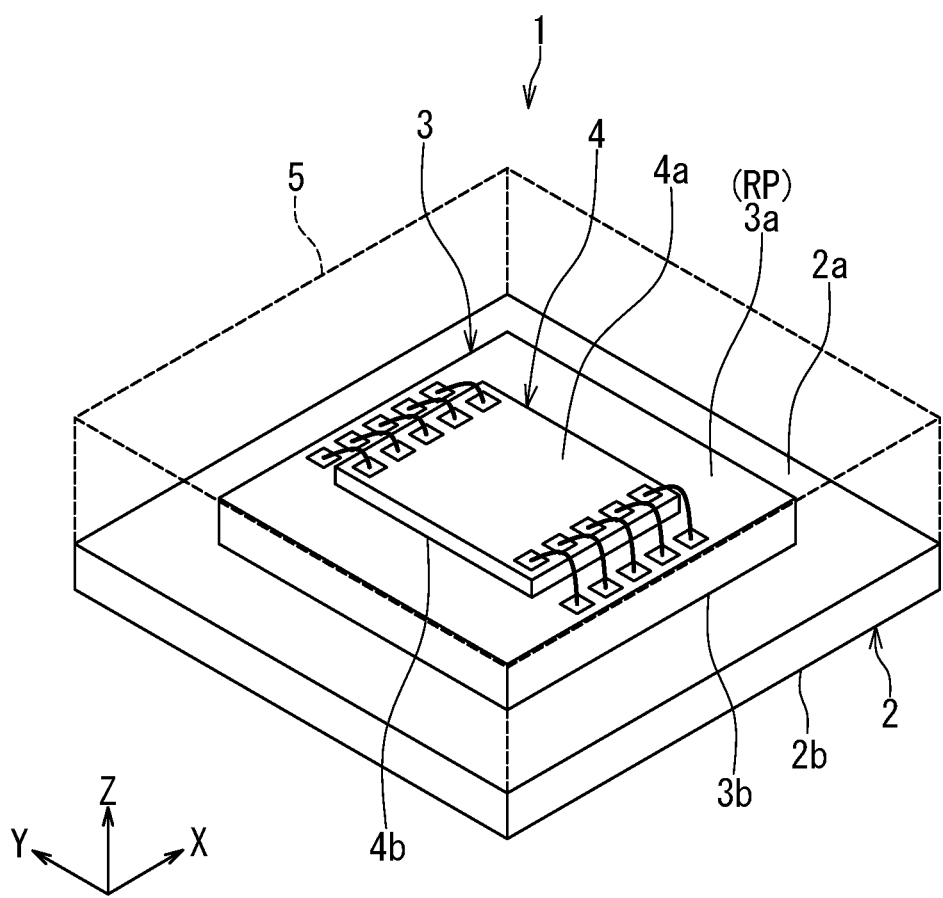
FIG. 1 is a perspective view of a magnetic sensor device according to a first embodiment of the invention.

As shown in FIG. 1, the magnetic sensor device 1 includes a printed circuit board 2, a composite chip component 3, and a sensor chip 4. The printed circuit board 2, the composite chip component 3 and the sensor chip 4 each have a rectangular parallelepiped shape. The printed circuit board 2, the composite chip component 3 and the sensor chip 4 have their respective outer surfaces.

The outer surfaces of the printed circuit board 2 include a top surface 2a and a bottom surface 2b opposite to each other, and four side surfaces connecting the top surface 2a and the bottom surface 2b. The outer surfaces of the composite chip component 3 include a top surface 3a and a bottom surface 3b opposite to each other, and four side surfaces connecting the top surface 3a and the bottom surface 3b. The outer surfaces of the sensor chip 4 include a top surface 4a and a bottom surface 4b opposite to each other, and four side surfaces connecting the top surface 4a and the bottom surface 4b.

The composite chip component 3 is mounted on the top surface 2a of the printed circuit board 2 in such an orientation that the bottom surface 3b faces the top surface 2a. The sensor chip 4 is mounted on the top surface 3a of the composite chip component 3 in such an orientation that the bottom surface 4b faces the top surface 3a.

The composite chip component 3 corresponds to the support in the present invention. The top surface 3a of the composite chip component 3 corresponds to the reference plane in the present invention. Hereinafter, the top surface 3a will also be referred to as the reference plane RP.

The composite chip component 3 has a group of terminals provided on the top surface 3a. The sensor chip 4 has a group of terminals provided on the top surface 4a. The group of terminals of the sensor chip 4 is connected to the group of terminals of the composite chip component 3 via bonding wires, for example.

The magnetic sensor device 1 further includes a sealing portion 5 for sealing the periphery of the composite chip component 3 and the sensor chip 4. For example, the sealing portion 5 is formed of a resin. The magnetic sensor device 1 is in the form of an electronic component package.

As will be described in detail later, the sensor chip 4 includes a first magnetic sensor 10, a second magnetic sensor 20, and a third magnetic sensor 30. The sensor chip 4 is mounted on the top surface 3a of the composite chip component 3, whereby the first to third magnetic sensors 10, 20 and 30 are integrated with the composite chip component 3. The top surface 3a of the composite chip component 3 also serves as the reference plane RP. One can thus say that the first to third magnetic sensors 10, 20 and 30 are mounted on the reference plane RP.

Now, a description will be given of a reference coordinate system and first to third sensor coordinate systems of the present embodiment. The reference coordinate system is a coordinate system that is set with reference to the composite chip component 3. The first to third sensor coordinate systems are coordinate systems that are set with reference to the first to third magnetic sensors 10, 20, and 30, respectively. The first to third sensor coordinate systems will hereinafter be simply referred to as a sensor coordinate system, as a generic term. An X direction, a Y direction, and a Z direction are defined in both of the reference coordinate system and the sensor coordinate system.

The X, Y, and Z directions of the reference coordinate system are orthogonal to each other. The Z direction of the reference coordinate system is a direction perpendicular to the top surface 3a of the composite chip component 3, and directed from the bottom surface 3b to the top surface 3a of the composite chip component 3. The X and Y directions of the reference coordinate system are directions parallel to the top surface 3a of the composite chip component 3.

The X, Y, and Z directions of the sensor coordinate system are orthogonal to each other. The Z direction of the sensor coordinate system is a direction perpendicular to the top surface 4a of the sensor chip 4, and directed from the bottom surface 4b to the top surface 4a of the sensor chip 4. The X and Y directions of the sensor coordinate system are directions parallel to the top surface 4a of the sensor chip 4.

For both of the reference coordinate system and the sensor coordinate system, the opposite direction to the X direction is defined as the −X direction, the opposite direction to the Y direction as the −Y direction, and the opposite direction to the Z direction as the −Z direction. Hereinafter, the term "above" refers to positions located forward of a reference position in the Z direction, and "below" refers to positions opposite from the "above" positions with respect to the reference position. For each component of the magnetic sensor device 1, the term "top surface" refers to a surface of the component lying at the end thereof in the Z direction, and "bottom surface" refers to a surface of the component lying at the end thereof in the −Z direction.

The magnetic sensor device 1 is designed so that the first to third sensor coordinate systems coincide with the reference coordinate system. However, at least one of the first to third sensor coordinate systems can deviate from the reference coordinate system due to reasons such as misalignment of the sensor chip 4 with the composite chip component 3, or misalignment between the first to third magnetic sensors 10, 20 and 30.

Hereinafter, unless otherwise specified, the X, Y, and Z directions shown in the drawings shall apply to both of the reference coordinate system and the sensor coordinate system.

Figure 2:
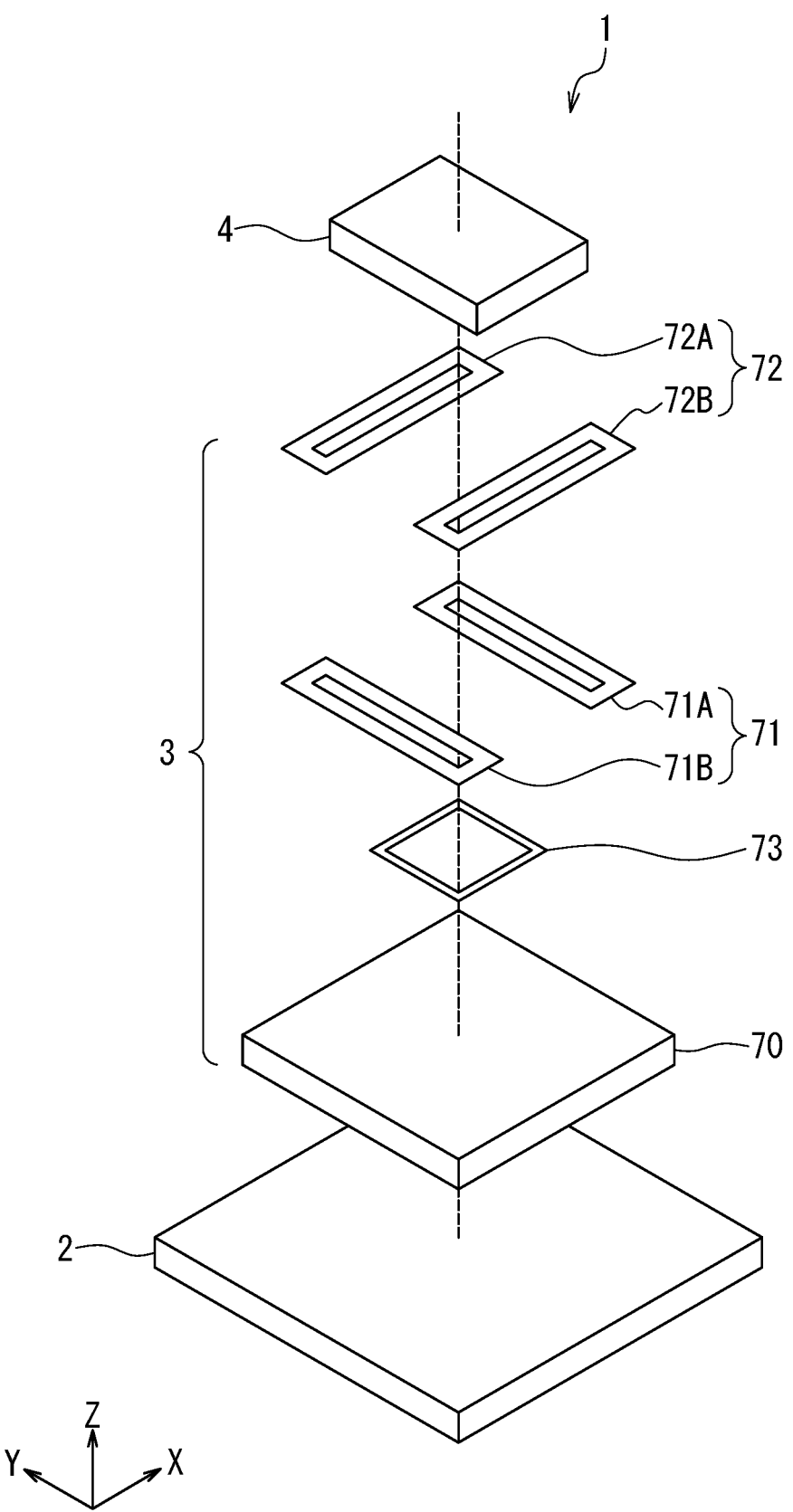
FIG. 2 is an exploded perspective view of the magnetic sensor device shown in FIG. 1.

FIG. 2 is an exploded perspective view of the magnetic sensor device 1 shown in FIG. 1. As shown in FIG. 2, the magnetic sensor device 1 further includes a first magnetic field generator 71, a second magnetic field generator 72, and a third magnetic field generator 73. The first to third magnetic field generators 71 to 73 are integrated with the composite chip component 3. In the present embodiment, specifically, the first to third magnetic field generators 71 to 73 are included in the composite chip component 3.

The composite chip component 3 further includes an integrated circuit chip 70. The integrated circuit chip 70 includes a correction processing circuit for performing correction processing on detection signals of the first to third magnetic sensors 10, 20 and 30, and a control circuit for controlling the first to third magnetic field generators 71, 72 and 73. The integrated circuit chip 70 is constructed of an application-specific integrated circuit (ASIC), for example.

The first magnetic field generator 71 is capable of generating a first additional magnetic field. The first magnetic field generator 71 includes a first coil 71A and a second coil 71B located at different positions from each other in the X direction of the reference coordinate system.

The second magnetic field generator 72 is capable of generating a second additional magnetic field. The second magnetic field generator 72 includes a third coil 72A and a fourth coil 72B located at different positions from each other in the Y direction of the reference coordinate system.

The third magnetic field generator 73 is capable of generating a third additional magnetic field. The third magnetic field generator 73 is constructed of a fifth coil.

Figure 3:
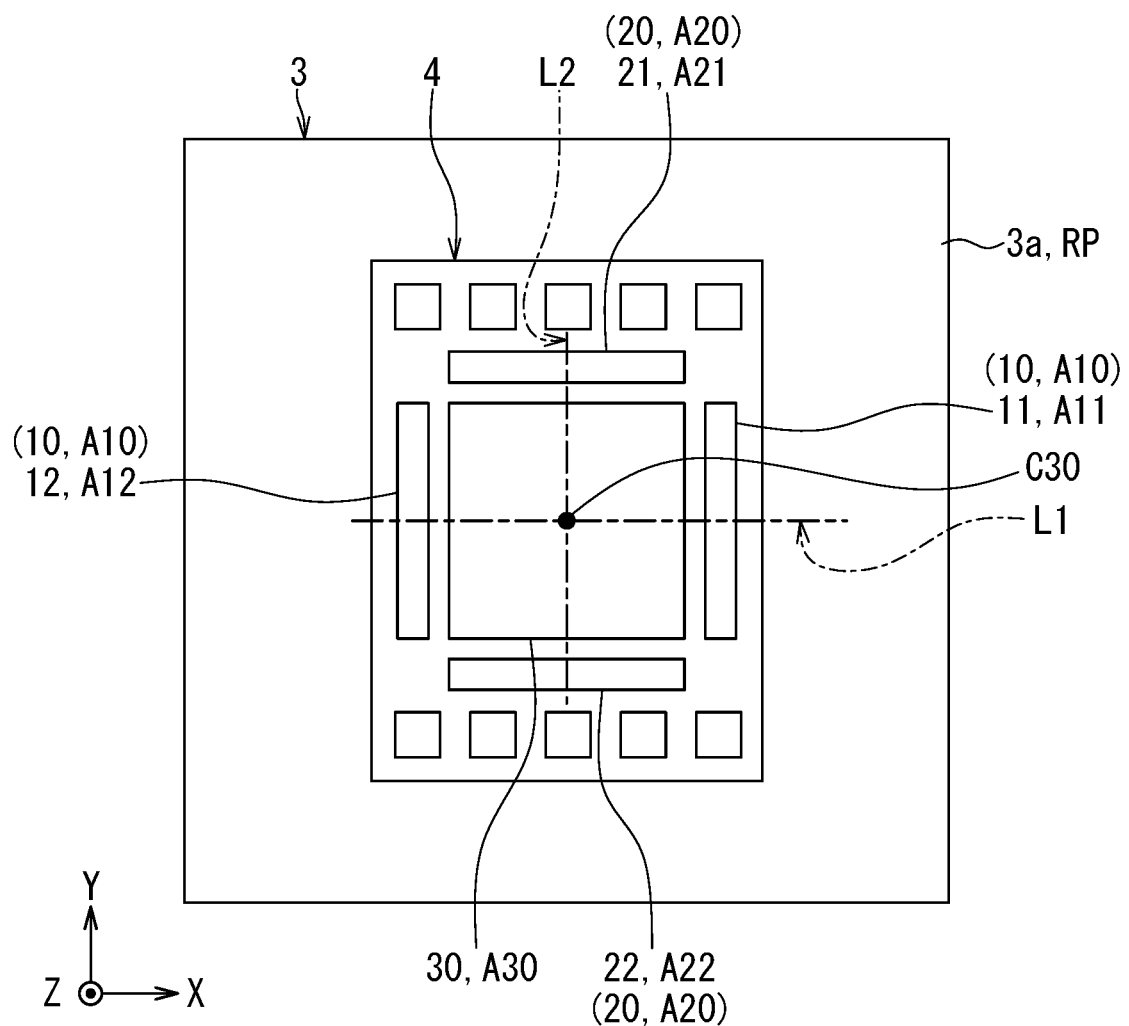
FIG. 3 is a plan view showing a composite chip component and a sensor chip of the magnetic sensor device shown in FIG. 1.

FIG. 3 is a plan view showing the composite chip component 3 and the sensor chip 4. As shown in FIG. 3, the sensor chip 4 includes the foregoing first, second and third magnetic sensors 10, 20 and 30.

The reference plane RP includes three different areas: a first area A10; a second area A20; and a third area A30. The first area A10 is an area formed by vertically projecting the first magnetic sensor 10 onto the reference plane RP. The second area A20 is an area formed by vertically projecting the second magnetic sensor 20 onto the reference plane RP. The third area A30 is an area formed by vertically projecting the third magnetic sensor 30 onto the reference plane RP.

Here, two mutually orthogonal straight lines that are located in the reference plane RP, pass through the centroid C30 of the third area A30 and are perpendicular to a third direction (the Z direction) will be referred to as a first straight line L1 and a second straight line L2. At least part of the first area A10 is located to be intersected by the first straight line L1. At least part of the second area A20 is located to be intersected by the second straight line L2. In the present embodiment, specifically, the first straight line L1 is parallel to the X direction of the reference coordinate system, and the second straight line L2 is parallel to the Y direction of the reference coordinate system.

In the present embodiment, the first magnetic sensor 10 includes a first portion 11 and a second portion 12 located at different positions from each other in the X direction of the reference coordinate system. The first area A10 includes a first partial area A11 formed by vertically projecting the first portion 11 of the first magnetic sensor 10 onto the reference plane RP, and a second partial area A12 formed by vertically projecting the second portion 12 of the first magnetic sensor 10 onto the reference plane RP. The first and second partial areas A11 and A12 are located on opposite sides of the third area A30 in a direction parallel to the first straight line L1.

The second magnetic sensor 20 includes a first portion 21 and a second portion 22 located at different positions from each other in the Y direction of the reference coordinate system. The second area A20 includes a third partial area A21 formed by vertically projecting the first portion 21 of the second magnetic sensor 20 onto the reference plane RP, and a fourth partial area A22 formed by vertically projecting the second portion 22 of the second magnetic sensor 20 onto the reference plane RP. The third and fourth partial areas A21 and A22 are located on opposite sides of the third area A30 in a direction parallel to the second straight line L2.

In the present embodiment, specifically, both the first and second partial areas A11 and A12 are located to be intersected by the first straight line L1. Both the third and fourth partial areas A21 and A22 are located to be intersected by the second straight line L2. In the present embodiment, specifically, each of the first and second partial areas A11 and A12 has a symmetrical shape with respect to the first straight line L1. Likewise, each of the third and fourth partial areas A21 and A22 has a symmetrical shape with respect to the second straight line L2.

The first magnetic sensor 10 need not necessarily be divided into a plurality of portions. In such a case, the first area A10 is a single area. Likewise, the second magnetic sensor 20 need not necessarily be divided into a plurality of portions. In such a case, the second area A20 is a single area.

If the first area A10 is composed of a plurality of partial areas separated from each other, one or more, but not all, of the plurality of partial areas may be located to be intersected by the first straight line L1. Likewise, if the second area A20 is composed of a plurality of partial areas separated from each other, one or more, but not all, of the plurality of partial areas may be located to be intersected by the second straight line L2.

Regardless of whether the first area A10 is a single area or composed of a plurality of partial areas, it is preferred that no portion of the first area A10 be intersected by the second straight line L2. Likewise, regardless of whether the second area A20 is a single area or composed of a plurality of partial areas, it is preferred that no portion of the second area A20 be intersected by the first straight line L1.

In the present embodiment, in particular, the first area A10 and the second area A20 as viewed from above have such a positional relationship that the first area A10 coincides with the second area A20 if the first area A10 is rotated 90° around the centroid C30 of the third area A30. In FIG. 3, if the first and second partial areas A11 and A12 are rotated 90° counterclockwise around the centroid C30, the first and second partial areas A11 and A12 coincide with the third and fourth partial areas A21 and A22, respectively.

Each of the first to third magnetic sensors 10, 20 and 30 includes at least one magnetic detection element.

Figure 4:
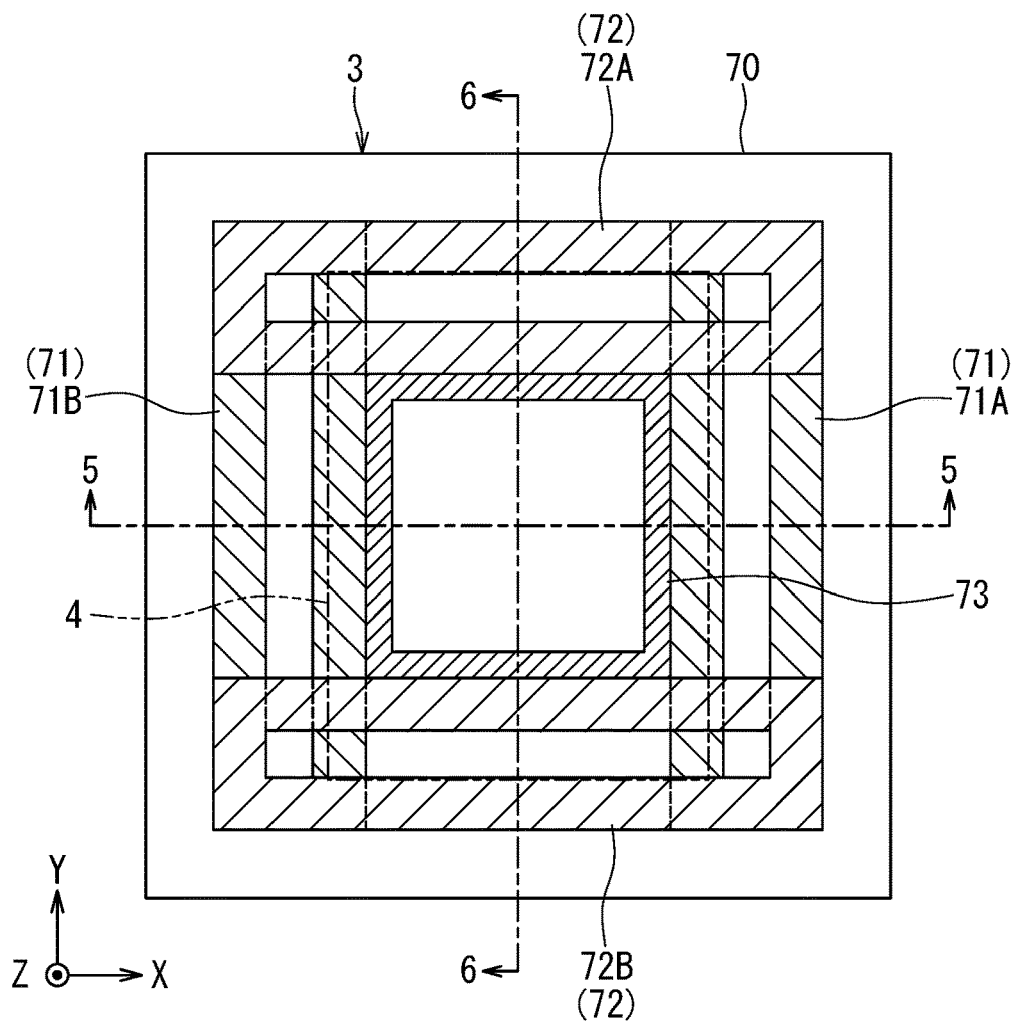
FIG. 4 is a plan view showing an example of the shape and layout of a first to a third magnetic field generator of the magnetic sensor device shown in FIG. 1.
Figure 5:
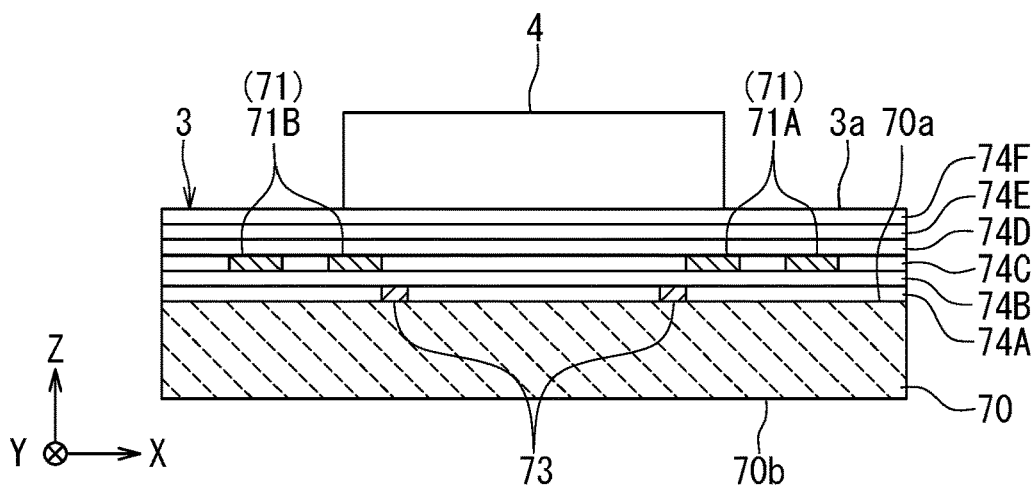
FIG. 5 is a cross-sectional view along line 5-5 of FIG. 4.
Figure 6:
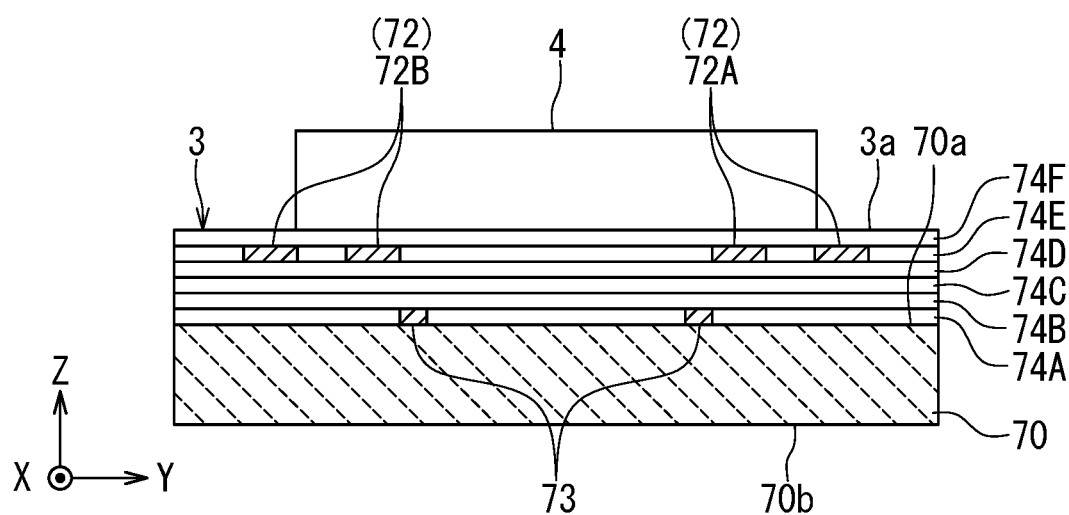
FIG. 6 is a cross-sectional view along line 6-6 of FIG. 4.

Reference is now made to FIG. 4 to FIG. 6 to describe an example structure of the composite chip component 3. The first to third magnetic field generators 71, 72 and 73 will be described first. FIG. 4 is a plan view showing an example of the shape and layout of the first to third magnetic field generators 71, 72 and 73. For the sake of convenience, in FIG. 4 the first to third magnetic field generators 71, 72 and 73 are shown hatched. FIG. 5 is a cross-sectional view along line 5-5 of FIG. 4. FIG. 6 is a cross-sectional view along line 6-6 of FIG. 4. In FIGS. 5 and 6, the ratios between the dimensions in the X, Y, and Z directions of the plurality of parts of the composite chip component 3 are not necessarily the same as the actual ones.

As shown in FIG. 4, each of the first and second coils 71A and 71B of the first magnetic field generator 71 as viewed from above has rectangular outer and inner peripheries that are long in the Y direction of the reference coordinate system. The first and second coils 71A and 71B each include a conductor wound a plurality of turns in a flat spiral shape along the XY plane of the reference coordinate system. As viewed from above, the first and second coils 71A and 71B are located to be intersected by the first straight line L1 shown in FIG. 3.

As viewed from above, a hollow portion inside the inner periphery of the first coil 71A is longer in the Y direction of the reference coordinate system than the first partial area A11 and is located forward of the first partial area A11 in the X direction of the reference coordinate system.

As viewed from above, a hollow portion inside the inner periphery of the second coil 71B is longer in the Y direction of the reference coordinate system than the second partial area A12, and is located forward of the second partial area A12 in the –X direction of the reference coordinate system.

As viewed from above, each of the third and fourth coils 72A and 72B of the second magnetic field generator 72 has rectangular outer and inner peripheries that are long in the X direction of the reference coordinate system. The third and fourth coils 72A and 72B each include a conductor wound a plurality of turns in a flat spiral shape along the XY plane of the reference coordinate system. As viewed from above, the third and fourth coils 72A and 72B are located to be intersected by the second straight line L2 shown in FIG. 3.

As viewed from above, a hollow portion inside the inner periphery of the third coil 72A is longer in the X direction of the reference coordinate system than the third partial area A21, and is located forward of the third partial area A21 in the Y direction of the reference coordinate system.

As viewed from above, a hollow portion inside the inner periphery of the fourth coil 72B is longer in the X direction of the reference coordinate system than the fourth partial area A22, and is located forward of the fourth partial area A22 in the −Y direction of the reference coordinate system.

As viewed from above, the fifth coil constituting the third magnetic field generator 73 has outer and inner peripheries of square or almost square shape. The fifth coil includes a conductor wound a plurality of turns in a flat spiral shape along the XY plane of the reference coordinate system. As viewed from above, the inner periphery of the fifth coil is located somewhat outside the outer edge of the third area A30 shown in FIG. 3.

As shown in FIGS. 5 and 6, the integrated circuit chip 70 has a top surface 70a and a bottom surface 70b. The top surface 70a of the integrated circuit chip 70 has an insulation property. The composite chip component 3 includes insulating layers 74A, 74B, 74C, 74D, 74E, and 74F each formed of an insulating material, in addition to the integrated circuit chip 70 and the first to third magnetic field generators 71, 72 and 73.

In the example shown in FIGS. 4 to 6, the third magnetic field generator 73 is disposed on the top surface 70a of the integrated circuit chip 70. The insulating layer 74A lies on the top surface 70a and surrounds the third magnetic field generator 73. The insulating layer 74B covers the third magnetic field generator 73 and the insulating layer 74A. The first and second coils 71A and 71B of the first magnetic field generator 71 are disposed on the insulating layer 74B. The insulating layer 73C lies on the insulating layer 74B and surrounds the coils 71A and 71B. The insulating layer 74D covers the coils 71A and 71B and the insulating layer 74C. The third and fourth coils 72A and 72B of the second magnetic field generator 72 are disposed on the insulating layer 74D. The insulating layer 74E lies on the insulating layer 74D and surrounds the coils 72A and 72B. The insulating layer 74F covers the coils 72A and 72B and the insulating layer 74E. The top surface 3a of the composite chip component 3 is constituted of the top surface of the insulating layer 74F.

Figure 7:
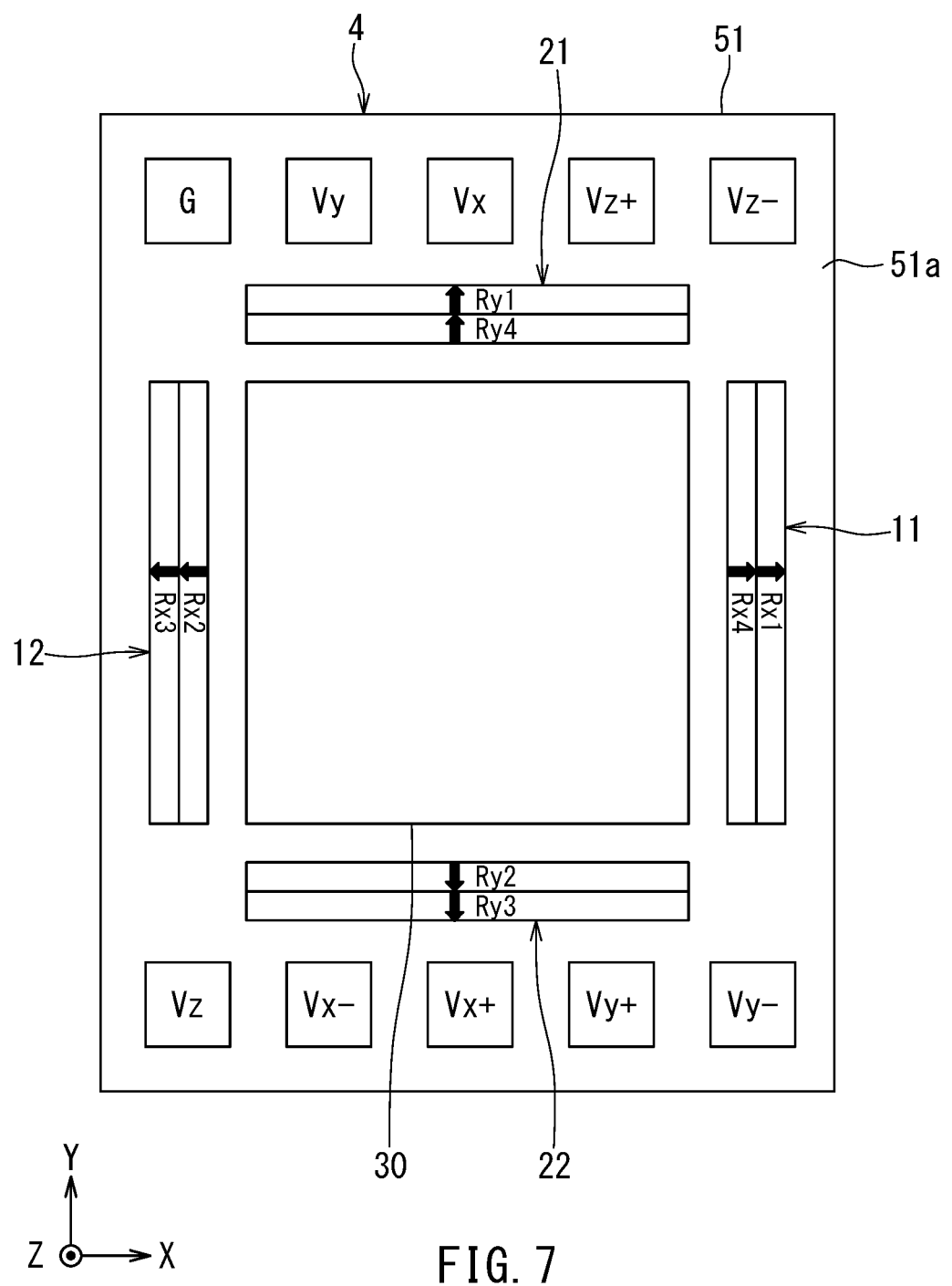
FIG. 7 is an explanatory diagram showing a configuration of the sensor chip of the first embodiment of the invention.
Figure 8:
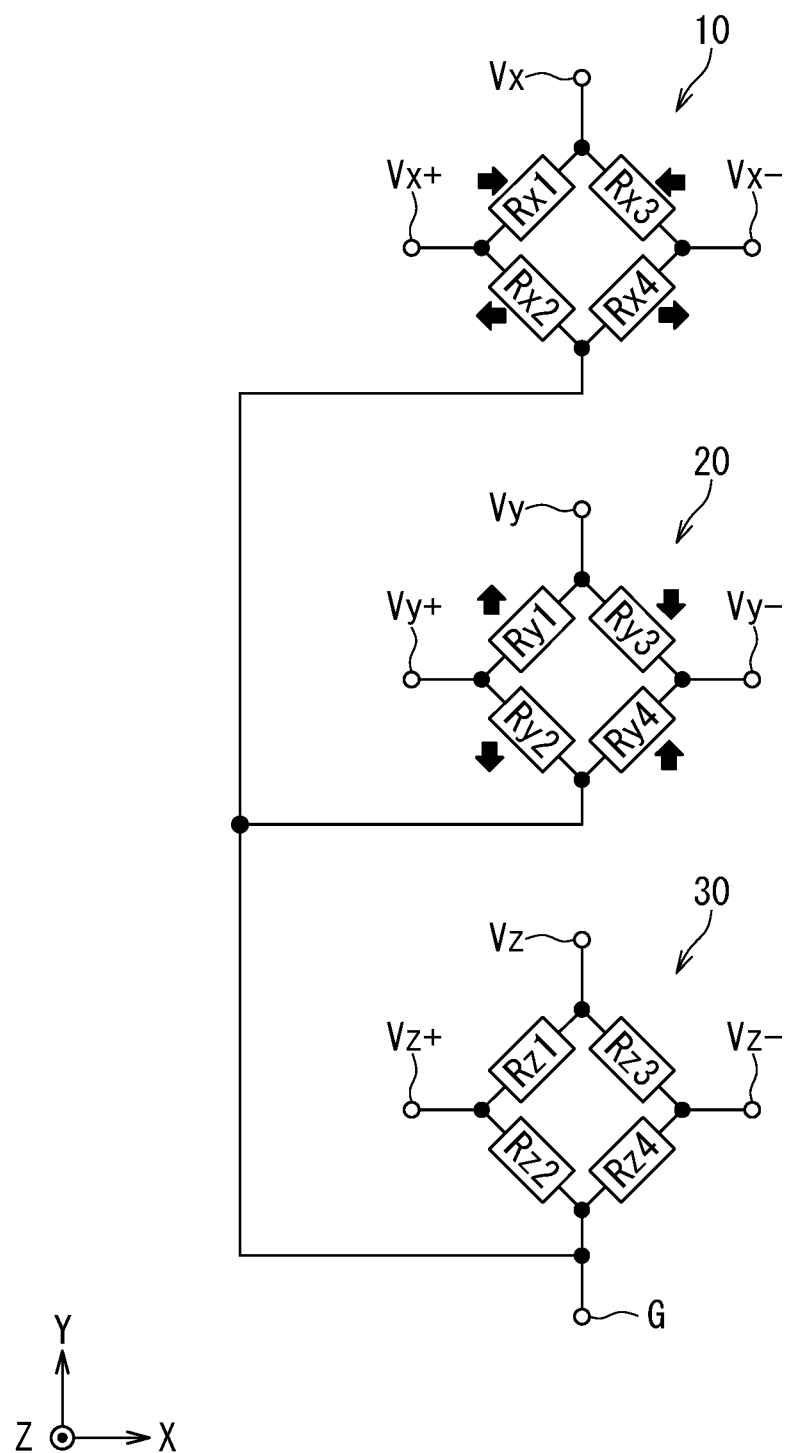
FIG. 8 is a circuit diagram showing an example circuit configuration of the sensor chip of the first embodiment of the invention.

Reference is now made to FIG. 7 and FIG. 8 to describe an example configuration of the sensor chip 4. FIG. 7 is an explanatory diagram showing a configuration of the sensor chip 4. FIG. 8 is a circuit diagram showing an example circuit configuration of the sensor chip 4.

As described above, the sensor chip 4 includes the first to third magnetic sensors 10, 20 and 30. The first magnetic sensor 10 is intended to detect a first external magnetic field component. The first external magnetic field component is a component of an external magnetic field and is in a first sensing direction. The second magnetic sensor 20 is intended to detect a second external magnetic field component. The second external magnetic field component is a component of the external magnetic field and is in a second sensing direction. The third magnetic sensor 30 is intended to detect a third external magnetic field component. The third external magnetic field component is a component of the external magnetic field and is in a third sensing direction.

In the present embodiment, specifically, the first sensing direction is a direction parallel to the X direction of the first sensor coordinate system. The first sensing direction includes the X direction and the −X direction of the first sensor coordinate system. The second sensing direction is a direction parallel to the Y direction of the second sensor coordinate system. The second sensing direction includes the Y direction and the −Y direction of the second sensor coordinate system. The third sensing direction is a direction parallel to the Z direction of the third sensor coordinate system. The third sensing direction includes the Z direction and the −Z direction of the third sensor coordinate system. In the present embodiment, specifically, the first and second sensing directions are parallel to the reference plane RP. The third sensing direction is perpendicular to the reference plane RP. If the first to third sensor coordinate systems coincide with each other, then it follows that the first to third sensing directions are orthogonal to each other.

As shown in FIG. 7, the sensor chip 4 further includes a substrate 51 supporting the first to third magnetic sensors 10, 20 and 30. The substrate 51 has a top surface 51a and a bottom surface. The first to third magnetic sensors 10, 20 and 30 are disposed on or above the top surface 51a of the substrate 51.

As shown in FIG. 7, the group of terminals of the sensor chip 4 includes: a power supply terminal Vx and output terminals Vx+ and Vx− associated with the first magnetic sensor 10; a power supply terminal Vy and output terminals Vy+ and Vy− associated with the second magnetic sensor 20; a power supply terminal Vz and output terminals Vz+ and Vz− associated with the third magnetic sensor 30; and a ground terminal G shared among the first to third magnetic sensors 10, 20 and 30.

In the example shown in FIG. 8, the first magnetic sensor 10 includes four resistor sections Rx1, Rx2, Rx3 and Rx4 constituting a Wheatstone bridge circuit. Each of the resistor sections Rx1, Rx2, Rx3 and Rx4 has a resistance that varies depending on the first external magnetic field component. The resistor section Rx1 is provided between the power supply terminal Vx and the output terminal Vx+. The resistor section Rx2 is provided between the output terminal Vx+ and the ground terminal G The resistor section Rx3 is provided between the power supply terminal Vx and the output terminal Vx−. The resistor section Rx4 is provided between the output terminal Vx− and the ground terminal G.

The second magnetic sensor 20 includes four resistor sections Ry1, Ry2, Ry3 and Ry4 constituting a Wheatstone bridge circuit. Each of the resistor sections Ry1, Ry2, Ry3 and Ry4 has a resistance that varies depending on the second external magnetic field component. The resistor section Ry1 is provided between the power supply terminal Vy and the output terminal Vy+. The resistor section Ry2 is provided between the output terminal Vy+ and the ground terminal G The resistor section Ry3 is provided between the power supply terminal Vy and the output terminal Vy−. The resistor section Ry4 is provided between the output terminal Vy− and the ground terminal G.

The third magnetic sensor 30 includes four resistor sections Rz1, Rz2, Rz3 and Rz4 constituting a Wheatstone bridge circuit. Each of the resistor sections Rz1, Rz2, Rz3 and Rz4 has a resistance that varies depending on an output magnetic field component outputted from a magnetic field conversion section, which will be described later. The resistor section Rz1 is provided between the power supply terminal Vz and the output terminal Vz+. The resistor section Rz2 is provided between the output terminal Vz+ and the ground terminal G The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rz4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer having a magnetization in a fixed direction, a free layer having a magnetization whose direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In each MR element, the free layer has a shape anisotropy that sets the direction of the magnetization easy axis to be orthogonal to the magnetization direction of the magnetization pinned layer.

In FIG. 8, the filled arrows indicate the magnetization directions of the magnetization pinned layers of the MR elements. In the example shown in FIG. 8, the magnetization pinned layers of the MR elements in each of the resistor sections Rx1 and Rx4 are magnetized in the X direction of the first sensor coordinate system. The magnetization pinned layers of the MR elements in each of the resistor sections Rx2 and Rx3 are magnetized in the −X direction of the first sensor coordinate system.

The magnetization pinned layers of the MR elements in each of the resistor sections Ry1 and Ry4 are magnetized in the Y direction of the second sensor coordinate system. The magnetization pinned layers of the MR elements in each of the resistor sections Ry2 and Ry3 are magnetized in the −Y direction of the second sensor coordinate system. The magnetization directions of the magnetization pinned layers of the MR elements in each of the resistor sections Rz1, Rz2, Rz3 and Rz4 will be described later.

A potential difference between the output terminals Vx+ and Vx− has a correspondence with the first external magnetic field component. The first magnetic sensor 10 generates the first detection signal corresponding to the potential difference between the output terminals Vx+ and Vx−. The first detection signal may be one obtained by adjusting the amplitude or offset of the potential difference between the output terminals Vx+ and Vx−.

A potential difference between the output terminals Vy+ and Vy− has a correspondence with the second external magnetic field component. The second magnetic sensor 20 generates the second detection signal corresponding to the potential difference between the output terminals Vy+ and Vy−. The second detection signal may be one obtained by adjusting the amplitude or offset of the potential difference between the output terminals Vy+ and Vy−.

A potential difference between the output terminals Vz+ and Vz− has a correspondence with the third external magnetic field component. The third magnetic sensor 30 generates the third detection signal corresponding to the potential difference between the output terminals Vz+ and Vz−. The third detection signal may be one obtained by adjusting the amplitude or offset of the potential difference between the output terminals Vz+ and Vz−.

Reference is now made to FIG. 7 to describe an example layout of the resistor sections Rx1, Rx2, Rx3, Rx4, Ry1, Ry2, Ry3, and Ry4. In this example, the first portion 11 of the first magnetic sensor 10 includes the resistor sections Rx1 and Rx4, and the second portion 12 of the first magnetic sensor 10 includes the resistor sections Rx2 and Rx3. The first portion 21 of the second magnetic sensor 20 includes the resistor sections Ry1 and Ry4, and the second portion 22 of the second magnetic sensor 20 includes the resistor sections Ry2 and Ry3.

In FIG. 7, the filled arrows indicate the magnetization directions of the magnetization pinned layers of the MR elements. In the example shown in FIG. 7, in each of the first portion 11 of the first magnetic sensor 10, the second portion 12 of the first magnetic sensor 10, the first portion 21 of the second magnetic sensor 20, and the second portion 22 of the second magnetic sensor 20, the magnetization pinned layers of the MR elements included therein have the same magnetization direction. Such an example makes it easy to set the magnetization directions of the magnetization pinned layers in a plurality of MR elements.

An example configuration of MR elements will now be described with reference to FIG. 9. An MR element 100 shown in FIG. 9 includes an antiferromagnetic layer 101, a magnetization pinned layer 102, a gap layer 103, and a free layer 104 which are stacked in this order, from closest to farthest from the substrate 51. The antiferromagnetic layer 101 is formed of an antiferromagnetic material, and is in exchange coupling with the magnetization pinned layer 102 to thereby pin the magnetization direction of the magnetization pinned layer 102.

Figure 9:
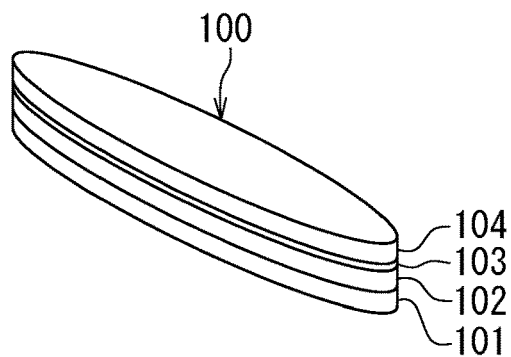
FIG. 9 is a perspective view showing a magnetoresistive element of the first embodiment of the invention.

It should be appreciated that the layers 101 to 104 of the MR element 100 may be stacked in the reverse order to that shown in FIG. 9. The MR element 100 may be configured without the antiferromagnetic layer 101. In such a case, the configuration of the MR element 100 may be such that, for example, the antiferromagnetic layer 101 and the magnetization pinned layer 102 are replaced with a magnetization pinned layer of an artificial antiferromagnetic structure, which includes two ferromagnetic layers and a nonmagnetic metal layer interposed between the two ferromagnetic layers. The magnetic detection element may be an element for detecting a magnetic field other than the MR element, such as a Hall element or a magnetic impedance element.

Figure 10:
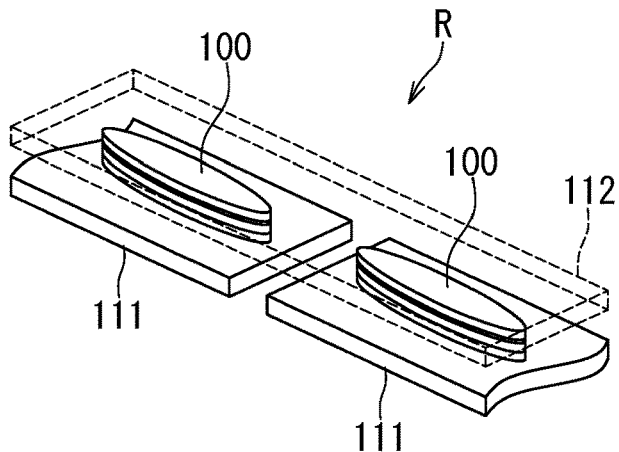
FIG. 10 is a perspective view showing part of a resistor section of the first embodiment of the invention.

Next, an example configuration of the resistor section R will be described with reference to FIG. 10. In this example, the resistor section R includes a plurality of MR elements 100 connected in series. The resistor section R further includes one or more connection layers for electrically connecting two MR elements 100 that are adjacent to each other in circuit configuration, so that the plurality of MR elements 100 are connected in series. In the example shown in FIG. 10 the resistor section R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, an example configuration of the third magnetic sensor 30 will be described with reference to FIG. 11. The third magnetic sensor 30 includes a soft magnetic structure 40 formed of a soft magnetic material, in addition to the resistor sections Rz1, Rz2, Rz3 and Rz4. The soft magnetic structure 40 includes a magnetic field conversion section 42 and at least one soft magnetic layer. The magnetic field conversion section 42 receives the third external magnetic field component and outputs an output magnetic field component that is in a direction perpendicular to the third sensing direction. The strength of the output magnetic field component has a correspondence with the strength of the third external magnetic field component. The third magnetic sensor 30 detects the strength of the third external magnetic field component by detecting the strength of the output magnetic field component.

Figure 11:
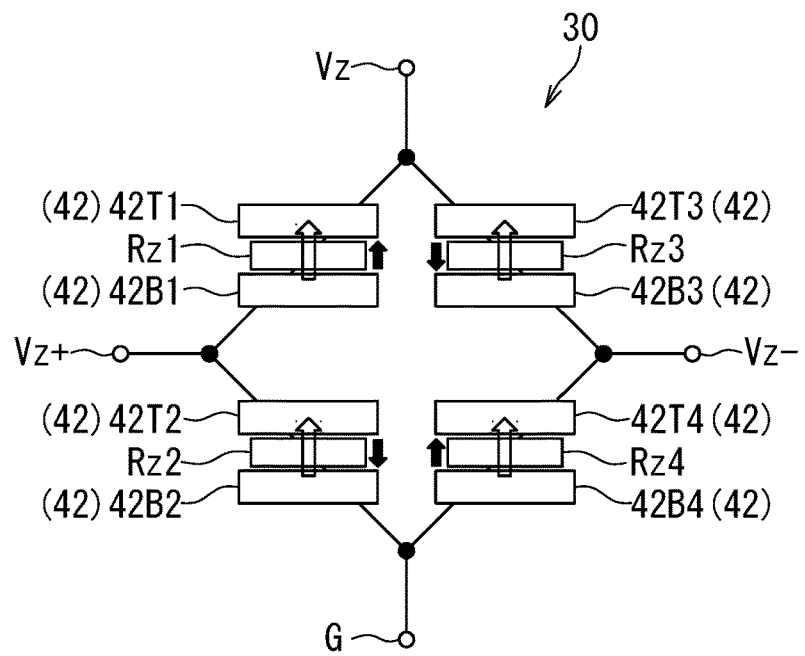
FIG. 11 is an explanatory diagram showing a configuration of a magnetic field conversion section and a third magnetic sensor of the first embodiment of the invention.

In the example shown in FIG. 11, the magnetic field conversion section 42 includes: a lower yoke 42B1 and an upper yoke 42T1 associated with the resistor section Rz1; a lower yoke 42B2 and an upper yoke 42T2 associated with the resistor section Rz2; a lower yoke 42B3 and an upper yoke 42T3 associated with the resistor section Rz3; and a lower yoke 42B4 and an upper yoke 42T4 associated with the resistor section Rz4.

The lower yokes 42B1, 42B2, 42B3 and 42B4 and the upper yokes 42T1, 42T2, 42T3 and 42T4 each have a rectangular parallelepiped shape elongated in a direction perpendicular to the Z direction of the third sensor coordinate system.

The lower yoke 42B1 and the upper yoke 42T1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. As viewed from above, the resistor section Rz1 lies between the lower yoke 42B1 and the upper yoke 42T1.

The lower yoke 42B2 and the upper yoke 42T2 are located near the resistor section Rz2. The lower yoke 42B2 is located closer to the top surface 51a of the substrate 51 than the resistor section Rz2. The upper yoke 42T2 is located farther from the top surface 51a of the substrate 51 than the resistor section Rz2. As viewed from above, the resistor section Rz2 lies between the lower yoke 42B2 and the upper yoke 42T2.

The lower yoke 42B3 and the upper yoke 42T3 are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz3. As viewed from above, the resistor section Rz3 lies between the lower yoke 42B3 and the upper yoke 42T3.

The lower yoke 42B4 and the upper yoke 42T4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. As viewed from above, the resistor section Rz4 lies between the lower yoke 42B4 and the upper yoke 42T4.

The output magnetic field component outputted by the magnetic field conversion section 42 contains a magnetic field component that is generated by the lower yoke 42B1 and the upper yoke 42T1 and applied to the resistor section Rz1, a magnetic field component that is generated by the lower yoke 42B2 and the upper yoke 42T2 and applied to the resistor section Rz2, a magnetic field component that is generated by the lower yoke 42B3 and the upper yoke 42T3 and applied to the resistor section Rz3, and a magnetic field component that is generated by the lower yoke 42B4 and the upper yoke 42T4 and applied to the resistor section Rz4.

In FIG. 11, the four hollow arrows indicate the direction of the magnetic field components applied to the resistor sections Rz1, Rz2, Rz3 and Rz4 when the third external magnetic field component is in the Z direction of the third sensor coordinate system. On the other hand, in FIG. 11 the four filled arrows indicate the magnetization directions of the magnetization pinned layers 102 of the MR elements 100 of the resistor sections Rz1, Rz2, Rz3 and Rz4, respectively. The magnetization directions of the magnetization pinned layers 102 of the MR elements 100 of the resistor sections Rz1 and Rz4 are the same as the directions of the magnetic field components that are applied to the resistor sections Rz1 and Rz4, respectively, when the third external magnetic field component is in the Z direction of the third sensor coordinate system. The magnetization directions of the magnetization pinned layers 102 of the MR elements 100 of the resistor sections Rz2 and Rz3 are opposite to the directions of the magnetic field components that are applied to the resistor sections Rz2 and Rz3, respectively, when the third external magnetic field component is in the Z direction of the third sensor coordinate system.

Now, the function of the third magnetic sensor 30 will be described. When there is no third external magnetic field component, the magnetization direction of the free layer 104 of each MR element 100 in the resistor sections Rz1, Rz2, Rz3 and Rz4 is perpendicular to the magnetization direction of the magnetization pinned layer 102.

If the third external magnetic field component is in the Z direction of the third sensor coordinate system, the magnetization direction of the free layer 104 of each MR element 100 in the resistor sections Rz1 and Rz4 tilts toward the magnetization direction of the magnetization pinned layer 102 from the direction perpendicular to the magnetization direction of the magnetization pinned layer 102. On the other hand, the magnetization direction of the free layer 104 of each MR element 100 in the resistor sections Rz2 and Rz3 tilts toward a direction opposite to the magnetization direction of the magnetization pinned layer 102 from the direction perpendicular to the magnetization direction of the magnetization pinned layer 102. As a result, the resistor sections Rz1 and Rz4 decrease in resistance while the resistor sections Rz2 and Rz3 increase in resistance, compared to when there is no third external magnetic field component.

In contrast to this, if the third external magnetic field component is in the −Z direction of the third sensor coordinate system, the resistor sections Rz1 and Rz4 increase in resistance while the resistor sections Rz2 and Rz3 decrease in resistance, compared to when there is no third external magnetic field component.

The amount of change in the resistance of each of the resistor sections Rz1, Rz2, Rz3 and Rz4 depends on the strength of the third external magnetic field component.

Changes in the direction and strength of the third external magnetic field component cause the resistor sections Rz1, Rz2, Rz3 and Rz4 to change in resistance such that the resistor sections Rz1 and Rz4 increase in resistance while the second and third resistor sections Rz2 and Rz3 decrease in resistance, or such that the resistor sections Rz1 and Rz4 decrease in resistance while the resistor sections Rz2 and Rz3 increase in resistance. This causes a change in a potential difference between the output terminals Vz+ and Vz−. It is thus possible to detect the third external magnetic field component based on the potential difference. The third magnetic sensor 30 generates the third detection signal corresponding to the potential difference between the output terminals Vz+ and Vz−. The third detection signal may be one obtained by adjusting the amplitude or offset of the potential difference between the output terminals Vz+ and Vz−.

Figure 12:
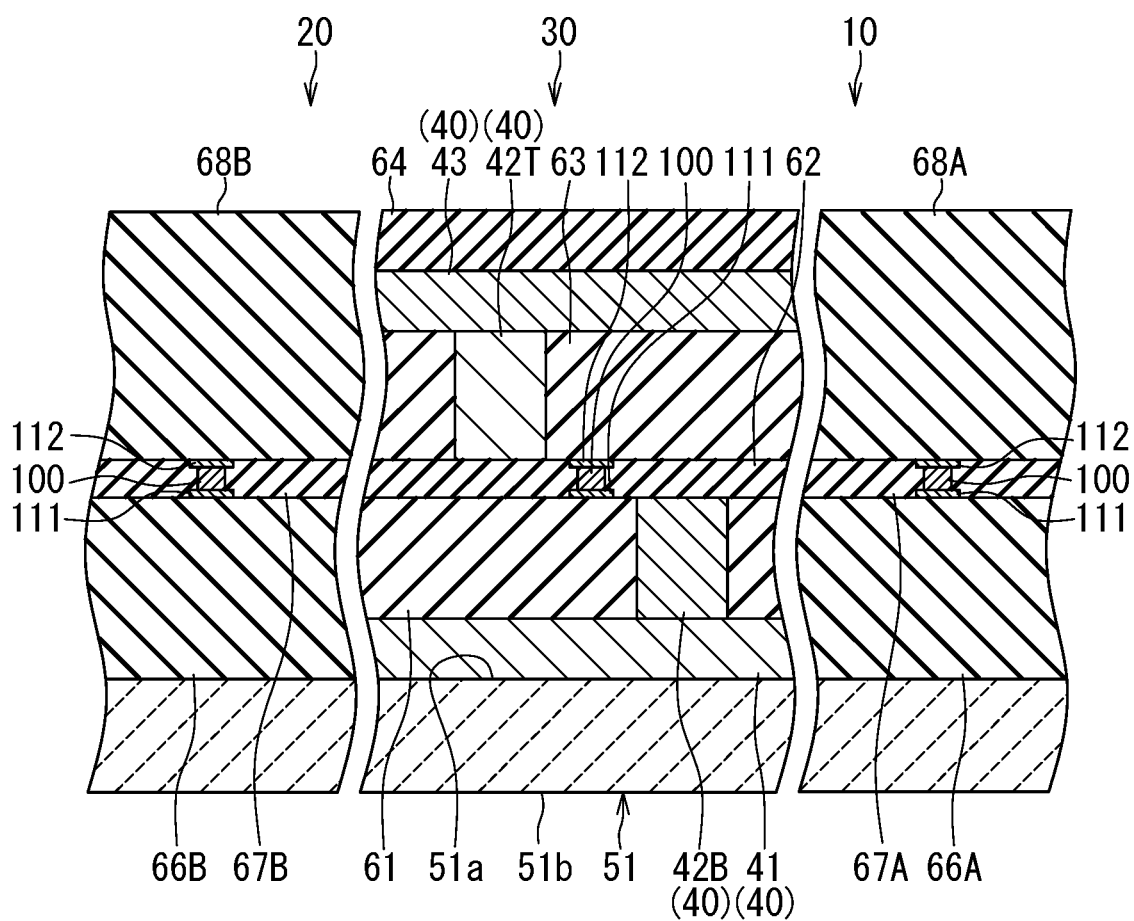
FIG. 12 is a cross-sectional view showing a portion of each of a first to a third magnetic sensor and a soft magnetic structure of the first embodiment of the invention.

Reference is now made to FIG. 12 to describe an example structure of the first to third magnetic sensors 10, 20 and 30. FIG. 12 shows a portion of each of the first to third magnetic sensors 10, 20 and 30. In this example, the first to third magnetic sensors 10, 20 and 30 are disposed on the substrate 51. The substrate 51 has the top surface 51a and the bottom surface 51b.

The first magnetic sensor 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are arranged on the insulating layer 66A. FIG. 12 shows one of the plurality of MR elements 100 included in the resistor sections Rx1, Rx2, Rx3 and Rx4, and also the upper connection layer 112 and the lower connection layer 111 connected to the MR element 100. The insulating layer 67A lies on the top surface of the insulating layer 66A and surrounds the resistor sections Rx1, Rx2, Rx3 and Rx4. The insulating layer 68A covers the resistor sections Rx1, Rx2, Rx3 and Rx4 and the insulating layer 67A.

The second magnetic sensor 20 is structurally similar to the first magnetic sensor 10. More specifically, the second magnetic sensor 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are arranged on the insulating layer 66B. FIG. 12 shows one of the plurality of MR elements 100 included in the resistor sections Ry1, Ry2, Ry3 and Ry4, and also the upper connection layer 112 and the lower connection layer 111 connected to the MR element 100. The insulating layer 67B lies on the top surface of the insulating layer 66B and surrounds the resistor sections Ry1, Ry2, Ry3 and Ry4. The insulating layer 68B covers the resistor sections Ry1, Ry2, Ry3 and Ry4 and the insulating layer 67B.

The third magnetic sensor 30 includes insulating layers 61, 62, 63 and 64 each formed of an insulating material, in addition to the resistor sections Rz1, Rz2, Rz3 and Rz4 and the soft magnetic structure 40. In the example shown in FIG. 12, the soft magnetic structure 40 includes the magnetic field conversion section 42 and two soft magnetic layers 41 and 43.

The magnetic field conversion section 42 includes the lower yokes 42B1, 42B2, 42B3 and 42B4 and the upper yokes 42T1, 42T2, 42T3 and 42T4 shown in FIG. 11. In FIG. 12, one of the lower yokes 42B1, 42B2, 42B3 and 42B4 is denoted by the reference symbol 42B, and a corresponding one of the upper yokes 42T1, 42T2, 42T3 and 42T4 is denoted by the reference symbol 42T.

The soft magnetic layer 41 lies on the top surface 51a of the substrate 51. The lower yokes 42B1, 42B2, 42B3 and 42B4 are arranged on the soft magnetic layer 41. The insulating layer 61 lies on the soft magnetic layer 41 and surrounds the lower yokes 42B1, 42B2, 42B3 and 42B4.

The resistor sections Rz1, Rz2, Rz3 and Rz4 are arranged on the insulating layer 61. FIG. 12 shows one of the plurality of MR elements 100 included in the resistor sections Rz1, Rz2, Rz3 and Rz4, and also the upper connection layer 112 and the lower connection layer 111 connected to the MR element 100. The insulating layer 62 lies on the lower yokes 42B1, 42B2, 42B3 and 42B4 and the insulating layer 61, and surrounds the resistor sections Rz1, Rz2, Rz3 and Rz4.

The upper yokes 42T1, 42T2, 42T3 and 42T4 are arranged on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

As viewed from above, the soft magnetic layers 41 and 43 extend across the entire area or almost the entire area of the third magnetic sensor 30. In other words, both of an area formed by vertically projecting the soft magnetic layer 41 onto the top surface 3a of the composite chip component 3, i.e., the reference plane RP, and an area formed by vertically projecting the soft magnetic layer 43 onto the reference plane RP coincide with or almost coincide with the third area A30.

In the example shown in FIG. 12, all the magnetic detection elements or MR elements 100 included in the first to third magnetic sensors 10, 20 and 30 are located at the same distance from the top surface 51a of the substrate 51. In the present embodiment, the top surface 51a of the substrate 51 is parallel to the top surface 3a of the composite chip component 3. All the MR elements 100 included in the first to third magnetic sensors 10, 20 and 30 are therefore located at the same distance from the top surface 3a of the composite chip component 3, i.e., the reference plane RP. The magnetic field conversion section 42 may include only either the lower yokes 42B1, 42B2, 42B3 and 42B4 or the upper yokes 42T1, 42T2, 42T3 and 42T4. The soft magnetic structure 40 may include only either one of the soft magnetic layers 41 and 43.

Figure 13:
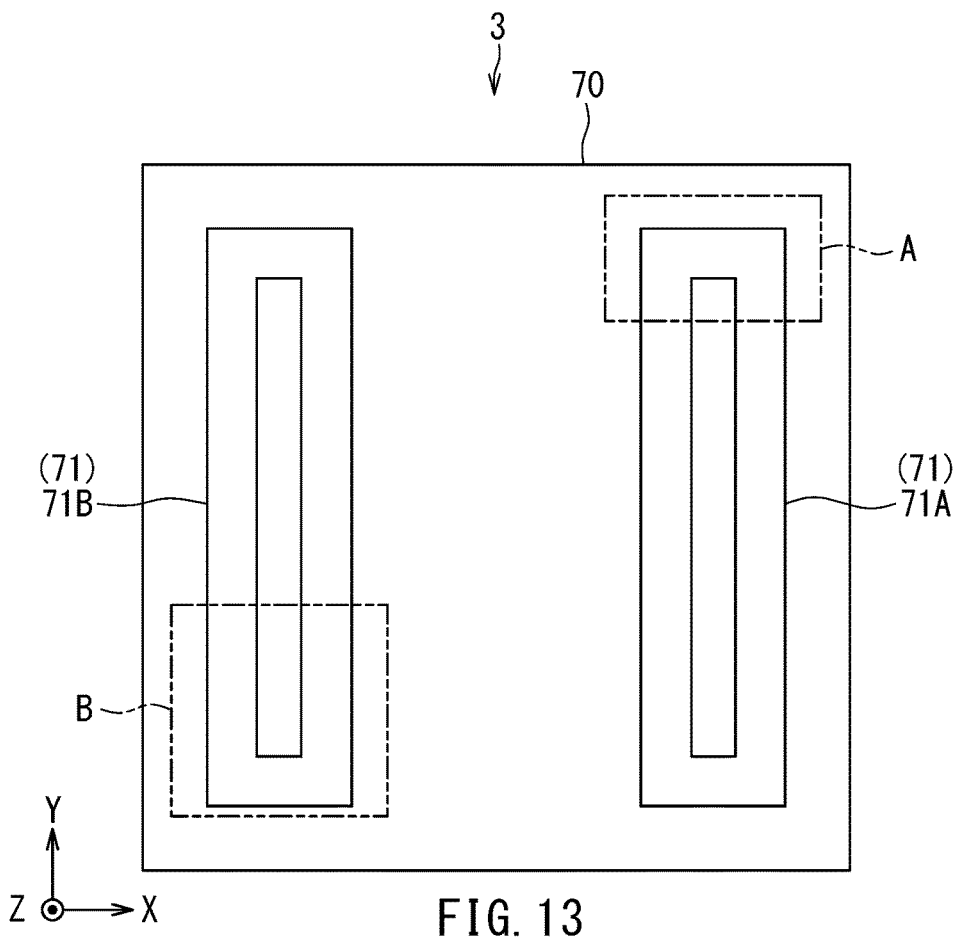
FIG. 13 is a plan view showing the first magnetic field generator of the first embodiment of the invention.
Figure 14:
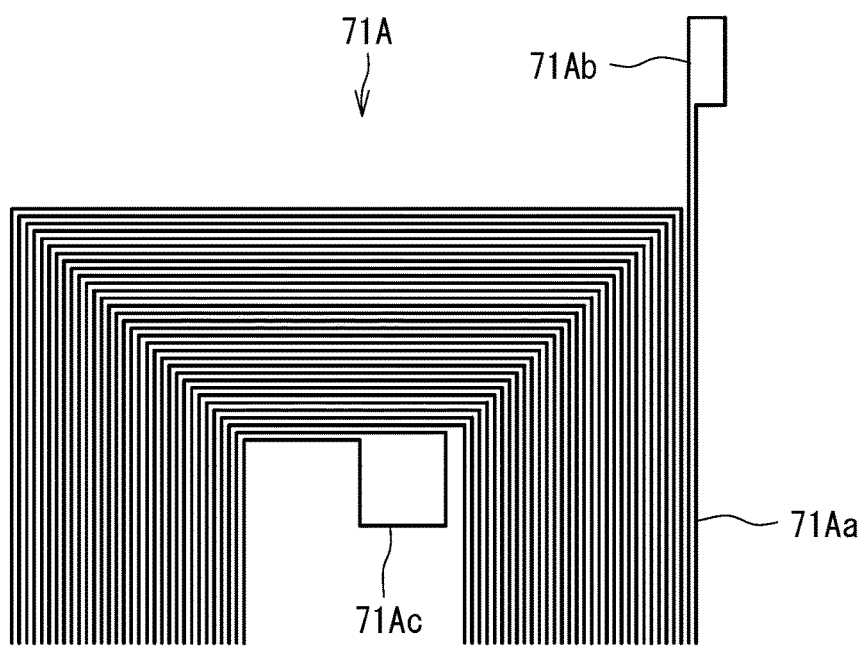
FIG. 14 is an enlarged plan view of a portion of the first magnetic field generator, the portion designated by the symbol A in FIG. 13.
Figure 15:
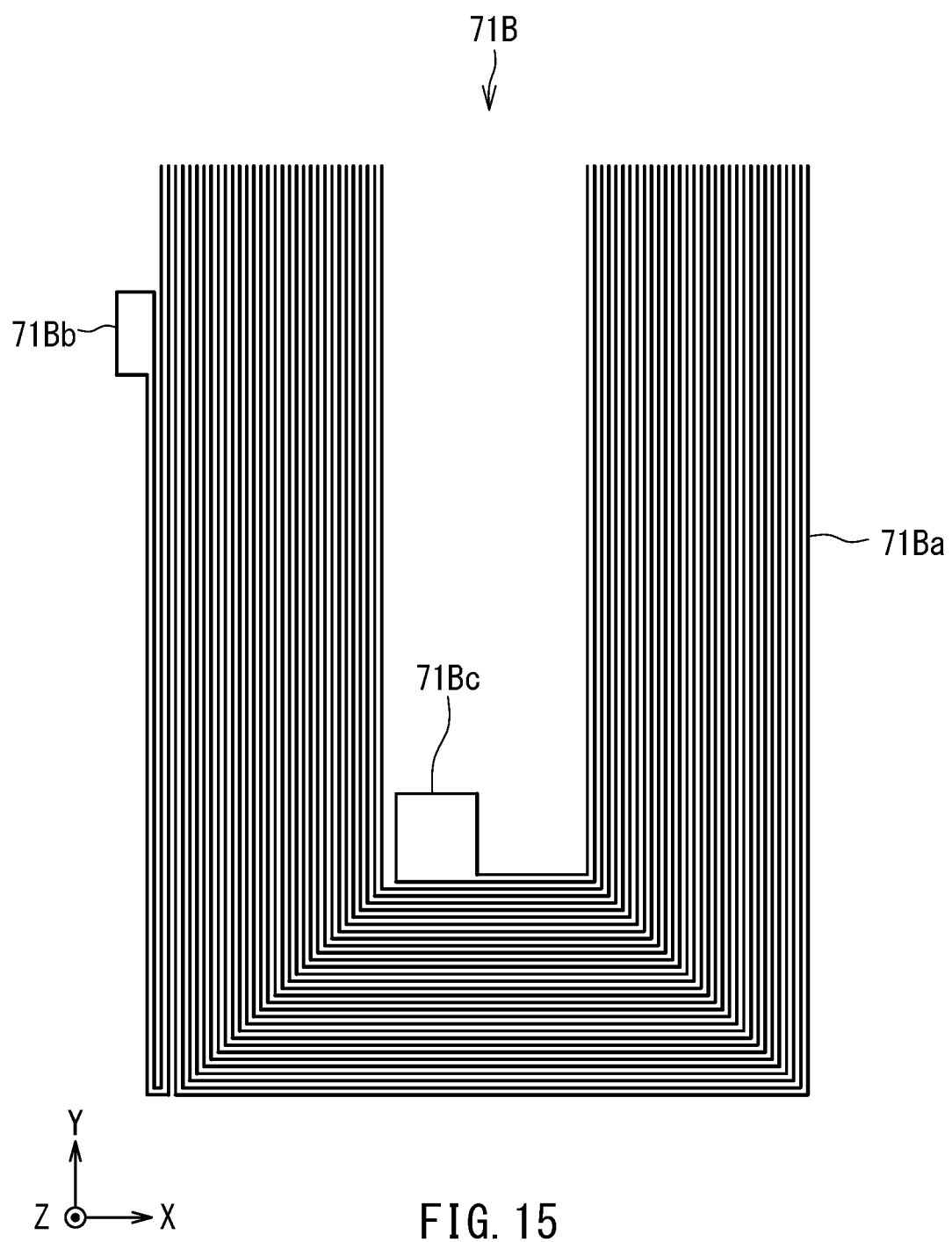
FIG. 15 is an enlarged plan view of a portion of the first magnetic field generator, the portion designated by the symbol B in FIG. 13.

Next, a configuration of the first magnetic field generator 71 will be described in detail with reference to FIGS. 13 to 15. FIG. 13 is a plan view showing the first magnetic field generator 71. FIG. 14 shows a portion designated by the symbol A in FIG. 13 of the first magnetic field generator 71 on an enlarged scale. The portion designated by the symbol A is a portion of the first coil 71A. FIG. 15 shows a portion designated by the symbol B in FIG. 13 of the first magnetic field generator 71 on an enlarged scale. The portion designated by the symbol B is a portion of the second coil 71B.

As shown in FIG. 14, the first coil 71A includes a conductor 71Aa wound a plurality of turns in a flat spiral shape along the XY plane of the reference coordinate system, and two terminals 71Ab and 71Ac connected to opposite ends of the conductor 71Aa. For example, the number of turns of the conductor 71Aa is 16. The conductor 71Aa has a thickness of 1 µm, for example. The conductor 71Aa has a width of 2 µm, for example. The distance between adjacent turns of the conductor 71Aa is 2 µm, for example. The terminals 71Ab and 71Ac are connected to the control circuit in the integrated circuit chip 70.

As shown in FIG. 15, the second coil 71B includes a conductor 71Ba wound a plurality of turns in a flat spiral shape along the XY plane of the reference coordinate system, and two terminals 71Bb and 71Bc connected to opposite ends of the conductor 71Ba. The number of turns, the thickness, and the width of the conductor 71Ba and the distance between adjacent turns of the conductor 71Ba may be the same as those of the conductor 71Aa. The terminals 71Bb and 71Bc are connected to the control circuit in the integrated circuit chip 70.

Next, a configuration of the second magnetic field generator 72 will be described in detail with reference to FIGS.

Figure 16:
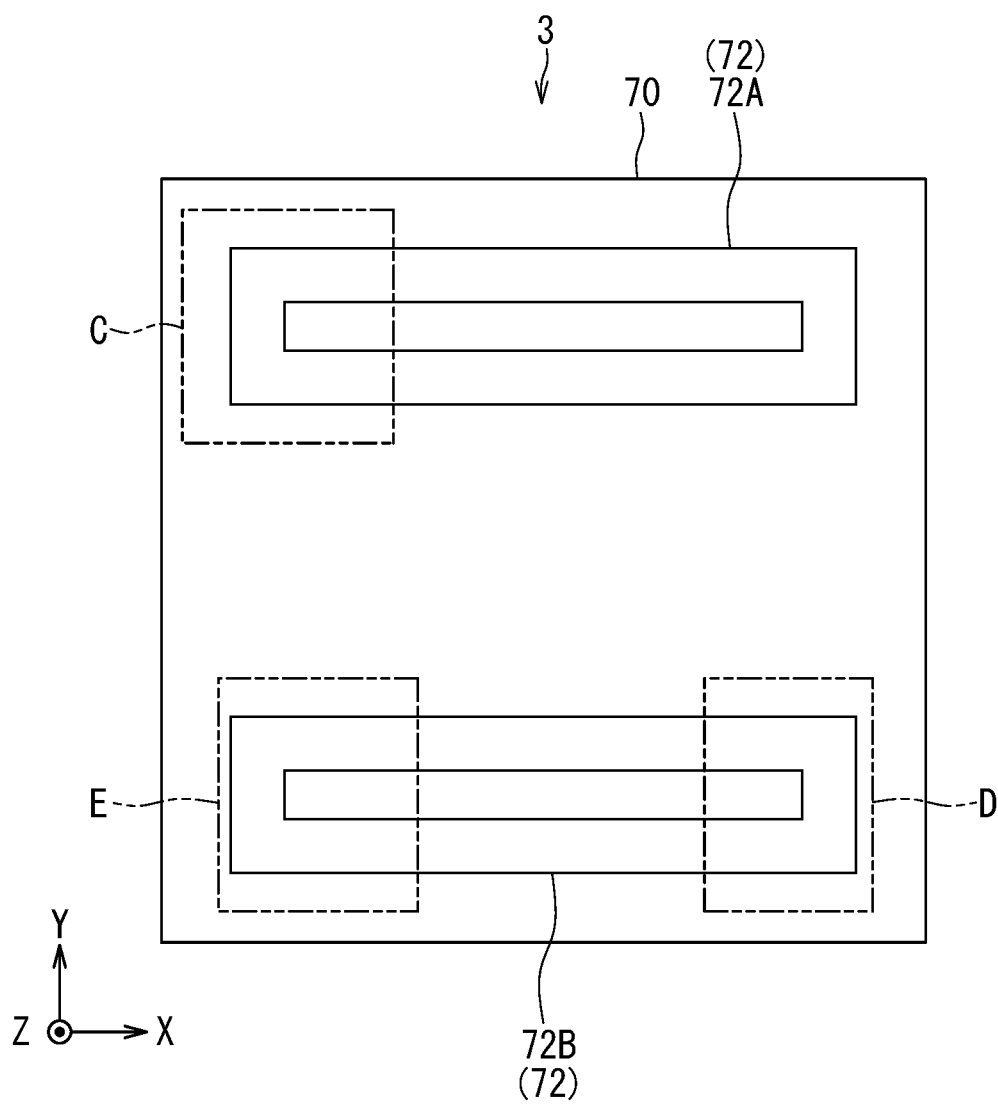
FIG. 16 is a plan view showing the second magnetic field generator of the first embodiment of the invention.
Figure 17:
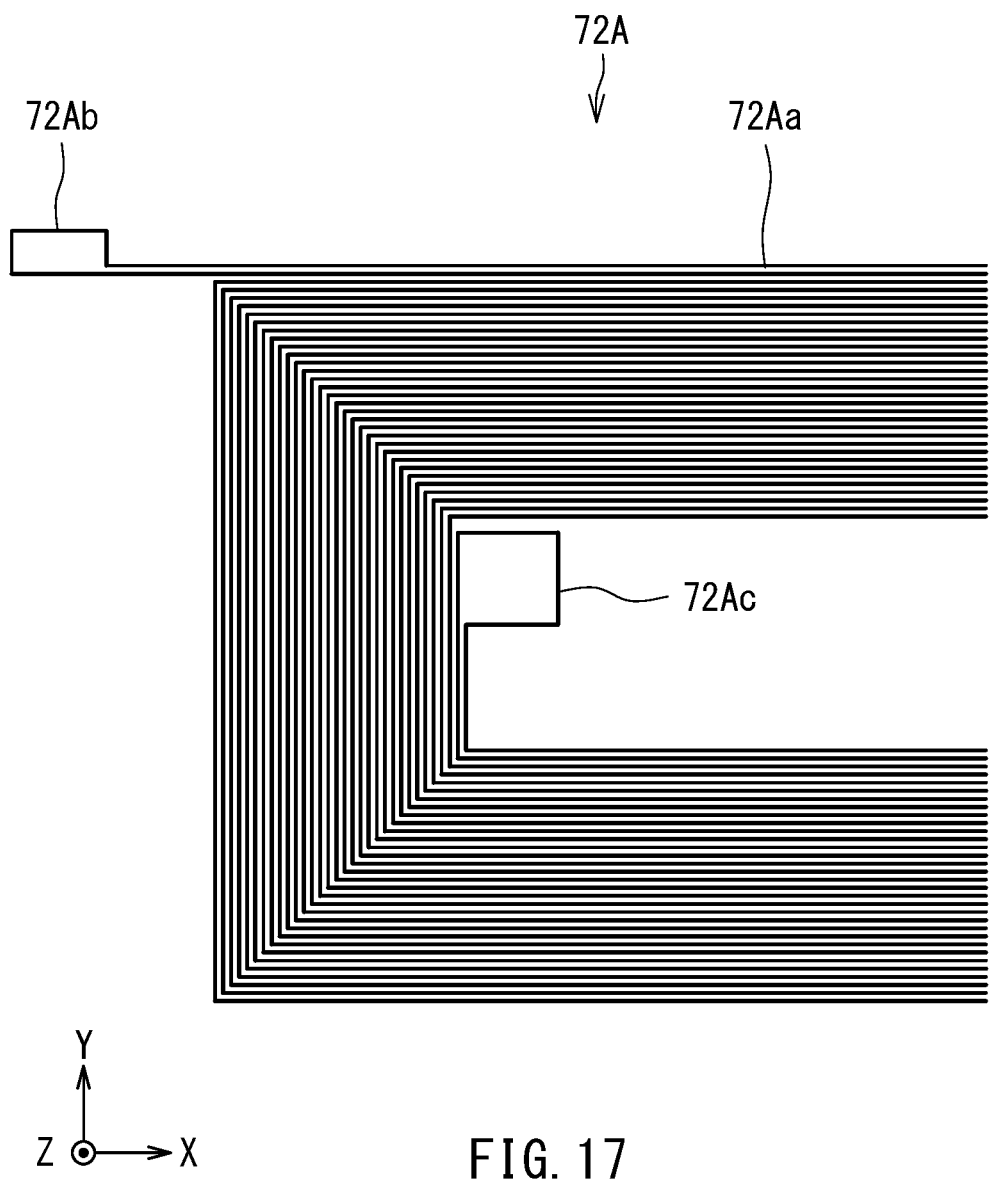
FIG. 17 is an enlarged plan view of a portion of the second magnetic field generator, the portion designated by the symbol C in FIG. 16.
Figure 18:
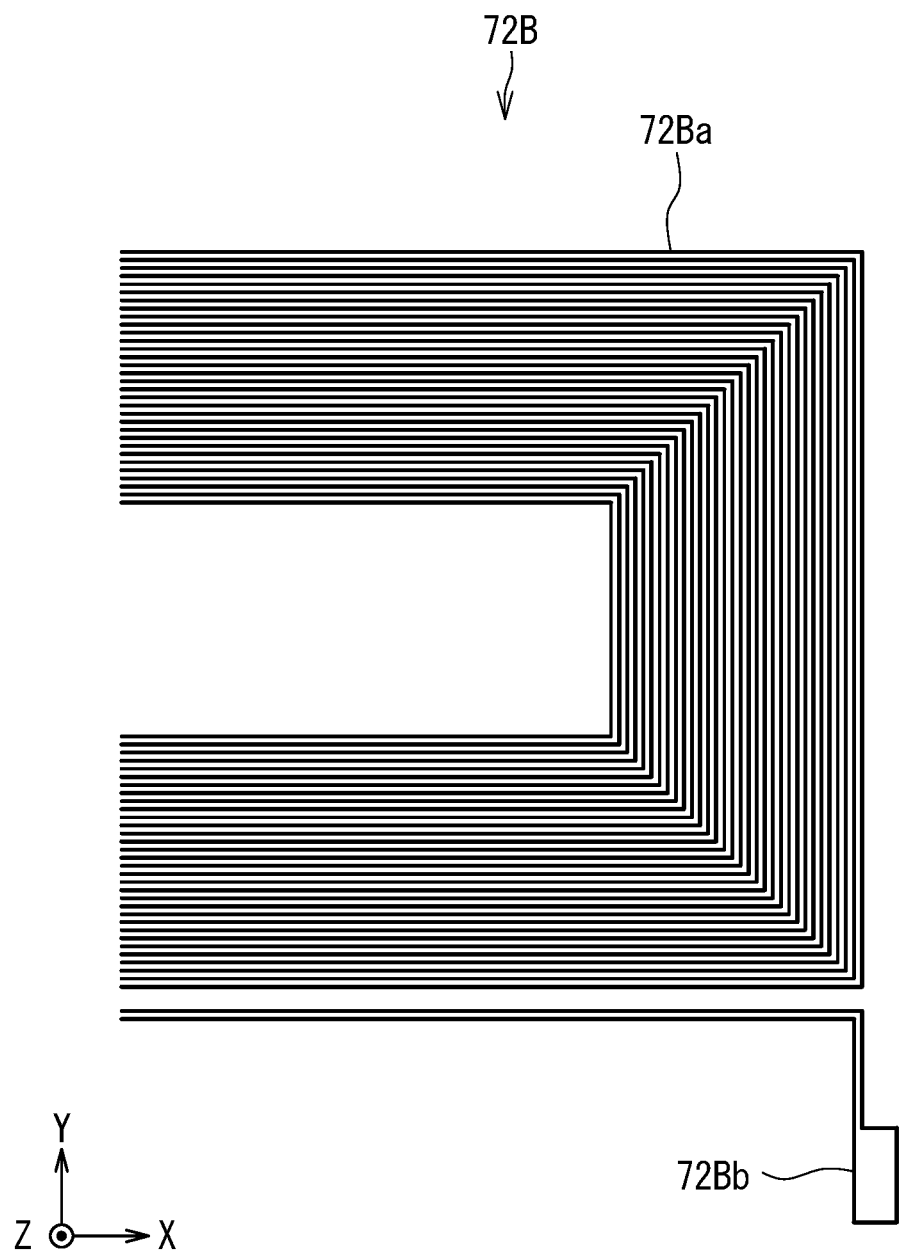
FIG. 18 is an enlarged plan view of a portion of the second magnetic field generator, the portion designated by the symbol D in FIG. 16.
Figure 19:
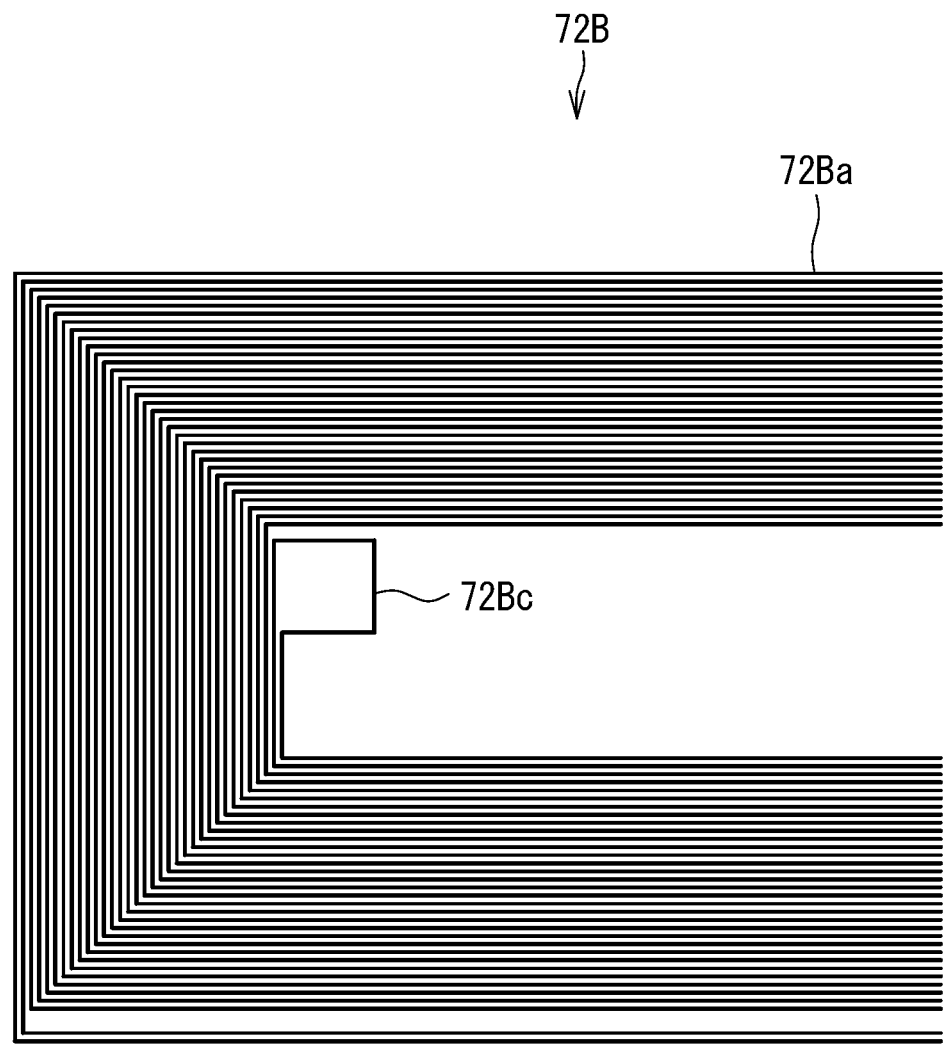
FIG. 19 is an enlarged plan view of a portion of the second magnetic field generator, the portion designated by the symbol E in FIG. 16.

16 to 19. FIG. 16 is a plan view showing the second magnetic field generator 72. FIG. 17 shows a portion designated by the symbol C in FIG. 16 of the second magnetic field generator 72 on an enlarged scale. The portion designated by the symbol C is a portion of the third coil 72A. FIG. 18 shows a portion designated by the symbol D in FIG. 16 of the second magnetic field generator 72 on an enlarged scale. The portion designated by the symbol D is a portion of the fourth coil 72B. FIG. 19 shows a portion designated by the symbol E in FIG. 16 of the second magnetic field generator 72 on an enlarged scale. The portion designated by the symbol E is another portion of the fourth coil 72B.

As shown in FIG. 17, the third coil 72A includes a conductor 72Aa wound a plurality of turns in a flat spiral shape, and two terminals 72Ab and 72Ac connected to opposite ends of the conductor 72Aa. The number of turns, the thickness, and the width of the conductor 72Aa and the distance between adjacent turns of the conductor 72Aa may be the same as those of the conductor 71Aa. The terminals 72Ab and 72Ac are connected to the control circuit in the integrated circuit chip 70.

As shown in FIGS. 18 and 19, the fourth coil 72B includes a conductor 72Ba wound a plurality of turns in a flat spiral shape, and two terminals 72Bb and 72Bc connected to opposite ends of the conductor 72Ba. The number of turns, the thickness, and the width of the conductor 72Ba and the distance between adjacent turns of the conductor 72Ba may be the same as those of the conductor 71Aa. The terminals 72Bb and 72Bc are connected to the control circuit in the integrated circuit chip 70.

Next, a configuration of the third magnetic field generator 73 will be described briefly. As described previously, the fifth coil constituting the third magnetic field generator 73 includes a conductor wound a plurality of turns in a flat spiral shape. The fifth coil further has two terminals connected to opposite ends of the conductor. The two terminals are connected to the control circuit in the integrated circuit chip 70.

Figure 20:
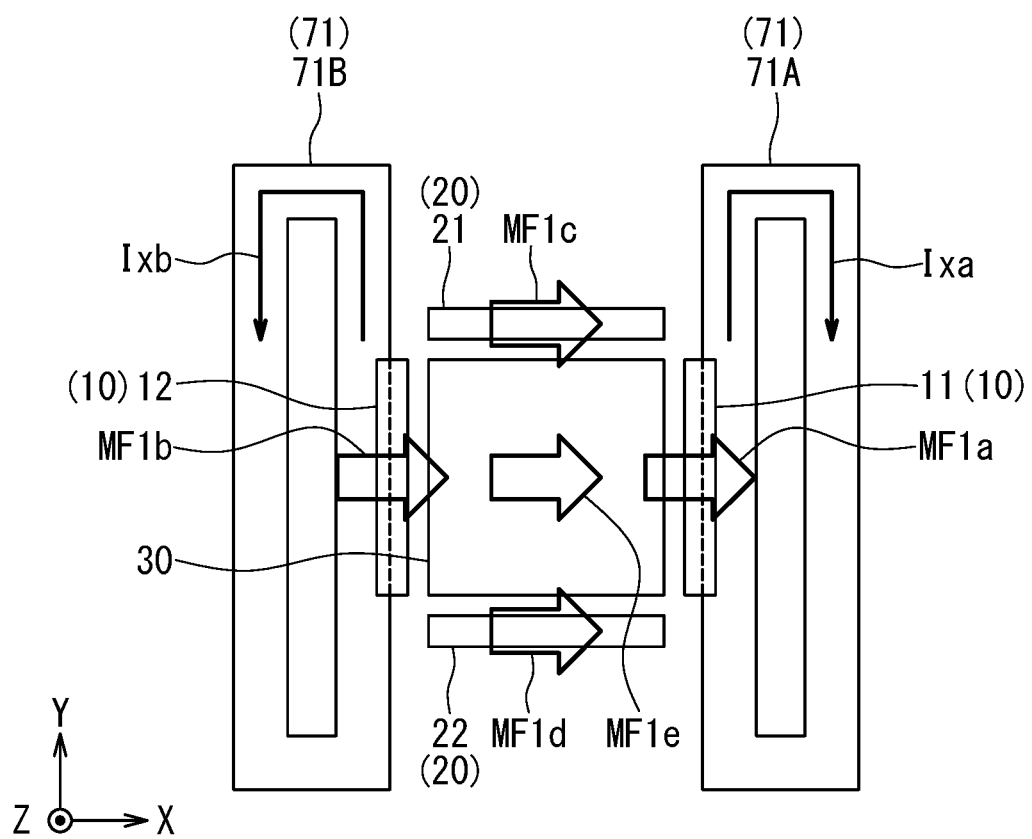
FIG. 20 is an explanatory diagram illustrating the function of the first magnetic field generator of the first embodiment of the invention.
Figure 21:
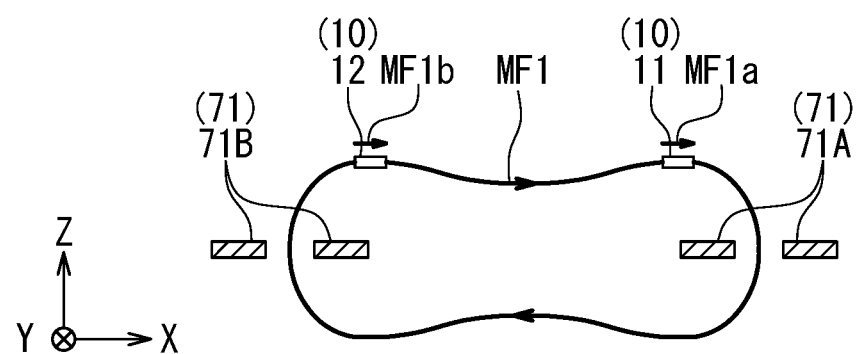
FIG. 21 is an explanatory diagram schematically illustrating a first additional magnetic field of the first embodiment of the invention.

The function of the first magnetic field generator 71 will now be described with reference to FIGS. 20 and 21. FIG. 20 is an explanatory diagram illustrating the function of the first magnetic field generator 71. FIG. 21 is an explanatory diagram schematically illustrating the first additional magnetic field. When the first additional magnetic field is generated by the first magnetic field generator 71, the first to third magnetic sensors 10, 20 and 30 are each subjected to a first additional magnetic field component. The first additional magnetic field component is a component of the first additional magnetic field and is in a direction parallel to a first direction. The first direction is a direction in the reference plane RP. In the present embodiment, specifically, the first direction coincides with the X direction of the reference coordinate system.

In the present embodiment, the first additional magnetic field is generated by passing a current Ixa through the first coil 71A of the first magnetic field generator 71 and passing a current Ixb through the second coil 71B of the first magnetic field generator 71. Here, the first additional magnetic field components applied to the first and second portions 11 and 12 of the first magnetic sensor 10 will be denoted by the symbols MF1$a$ and MF1$b$, respectively. The first additional magnetic field components applied to the first and second portions 21 and 22 of the second magnetic sensor 20 will be denoted by the symbols MF1$c$ and MF1$d$, respectively. The first additional magnetic field component applied to the third magnetic sensor 30 will be denoted by the symbol MF1$e$.

In FIG. 20, the arrow designated by the symbol Ixa indicates the direction of the current Ixa, and the arrow designated by the symbol Ixb indicates the direction of the current Ixb. In FIG. 21, the curve designated by the symbol MF1 represents a magnetic flux MF1 corresponding to the first additional magnetic field and passing through the first and second portions 11 and 12 of the first magnetic sensor 10. As shown in FIG. 20, with the direction of the current Ixa clockwise as viewed from above and the direction of the current Ixb counterclockwise as viewed from above, the magnetic flux MF1 flows as indicated by the arrows in FIG. 21. In such a case, all the directions of the first additional magnetic field components MF1$a$, MF1$b$, MF1$c$, MF1$d$, and MF1$e$ coincide with the X direction of the reference coordinate system. The currents Ixa and Ixb are equal or almost equal in magnitude.

If the directions of the currents Ixa and Ixb shown in FIG. 20 are each reversed, the magnetic flux MF1 flows in a direction reverse to that in the example shown in FIG. 21. In such a case, all the directions of the first additional magnetic field components MF1$a$, MF1$b$, MF1$c$, MF1$d$, and MF1$e$ coincide with the −X direction of the reference coordinate system.

The relationship between the magnitudes of the currents Ixa and Ixb and the strengths of the first additional magnetic field components MF1$a$, MF1$b$, MF1$c$, and MF1$e$ is determined in advance. When the magnitudes of the currents Ixa and Ixb have a certain value, MF1$a$ and MF1$b$ are equal or almost equal in strength, and MF and MF1$d$ are equal or almost equal in strength. When the magnitudes of the currents Ixa and Ixb have a certain value, the strength of each of MF1$a$ and MF1$b$, the strength of each of MF1$c$ and MF1$d$, and the strength of MF1$e$ may be different from each other. For example, the strength of each of MF1$a$ and MF1$b$ may be higher than the strength of each of MF1$c$ and MF and the strength of MF1$e$.

Figure 22:
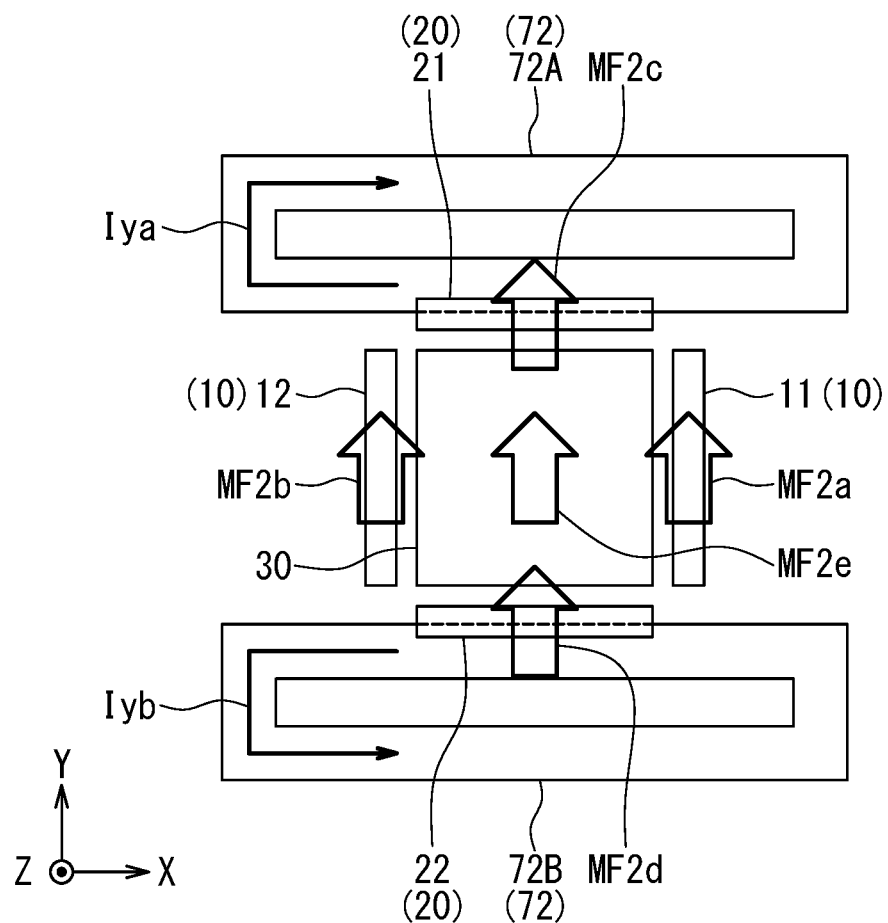
FIG. 22 is an explanatory diagram illustrating the function of the second magnetic field generator of the first embodiment of the invention.
Figure 23:
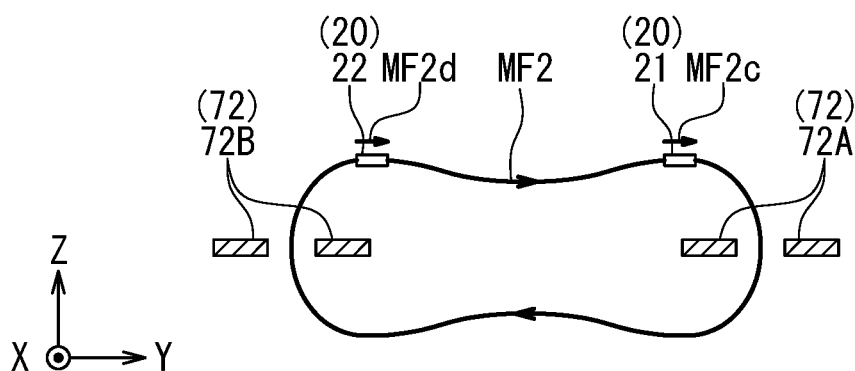
FIG. 23 is an explanatory diagram schematically illustrating a second additional magnetic field of the first embodiment of the invention.

The function of the second magnetic field generator 72 will now be described with reference to FIGS. 22 and 23. FIG. 22 is an explanatory diagram illustrating the function of the second magnetic field generator 72. FIG. 23 is an explanatory diagram schematically illustrating the second additional magnetic field. When the second additional magnetic field is generated by the second magnetic field generator 72, the first to third magnetic sensors 10, 20 and 30 are each subjected to a second additional magnetic field component. The second additional magnetic field component is a component of the second additional magnetic field and is in a direction parallel to a second direction. The second direction is a direction in the reference plane RP, and different from the first direction. In the present embodiment, specifically, the second direction coincides with the Y direction of the reference coordinate system.

In the present embodiment, the second additional magnetic field is generated by passing a current Iya through the third coil 72A of the second magnetic field generator 72 and passing a current Iyb through the fourth coil 72B of the second magnetic field generator 72. Here, the second additional magnetic field components applied to the first and second portions 11 and 12 of the first magnetic sensor 10 will be denoted by the symbols MF2$a$ and MF2$b$, respectively. The second additional magnetic field components applied to the first and second portions 21 and 22 of the second magnetic sensor 20 will be denoted by the symbols MF2$c$ and MF2$d$, respectively. The second additional magnetic field component applied to the third magnetic sensor 30 will be denoted by the symbol MF2$e$.

In FIG. 22, the arrow designated by the symbol Iya indicates the direction of the current Iya, and the arrow designated by the symbol Iyb indicates the direction of the current Iyb. In FIG. 23, the curve designated by the symbol MF2 represents a magnetic flux MF2 corresponding to the second additional magnetic field and passing through the first and second portions 21 and 22 of the second magnetic sensor 20. As shown in FIG. 22, with the direction of the current Iya clockwise as viewed from above and the direction of the current Iyb counterclockwise as viewed from above, the magnetic flux MF2 flows as indicated by the arrows in FIG. 23. In such a case, all the directions of the second additional magnetic field components MF2a, MF2b, MF2c, MF2d, and MF2e coincide with the Y direction of the reference coordinate system. The currents Iya and Iyb are equal or almost equal in magnitude.

If the directions of the currents Iya and Iyb shown in FIG. 22 are each reversed, the magnetic flux MF2 flows in a direction reverse to that in the example shown in FIG. 23. In such a case, all the directions of the second additional magnetic field components MF2a, MF2b, MF2c, MF2d, and MF2e coincide with the −Y direction of the reference coordinate system.

The relationship between the magnitudes of the currents Iya and Iyb and the strengths of the second additional magnetic field components MF2a, MF2b, MF2c, MF2d, and MF2e is determined in advance. When the magnitudes of the currents Iya and Iyb have a certain value, MF2a and MF2b are equal or almost equal in strength, and MF2c and MF2d are equal or almost equal in strength. When the magnitudes of the currents Iya and Iyb have a certain value, the strength of each of MF2a and MF2b, the strength of each of MF2c and MF2d, and the strength of MF2e may be different from each other. For example, the strength of each of MF2c and MF2d may be higher than the strength of each of MF2a and MF2b and the strength of MF2e.

The third additional magnetic field generated by the third magnetic field generator 73 will now be described with reference to FIGS. 3 and 4. When the third additional magnetic field is generated by the third magnetic field generator 73, the third magnetic sensor 30 is subjected to a third additional magnetic field component. The third additional magnetic field component is a component of the third additional magnetic field and is in a direction parallel to a third direction. The third direction is perpendicular to the reference plane RP. In the present embodiment, specifically, the third direction coincides with the Z direction of the reference coordinate system.

In the present embodiment, the third additional magnetic field is generated by passing a current through the fifth coil constituting the third magnetic field generator 73. When the direction of the current passed through the fifth coil is counterclockwise as viewed from above, the direction of the third additional magnetic field component coincides with the Z direction of the reference coordinate system. When the direction of the current passed through the fifth coil is clockwise as viewed from above, the direction of the third additional magnetic field component coincides with the −Z direction of the reference coordinate system.

In the present embodiment, the third additional magnetic field component is not applied at all or hardly applied to each of the first and second magnetic sensors 10 and 20.

Next, a description will be given of the results of a simulation that was performed to verify the function of the first and second magnetic field generators 71 and 72. An example model corresponding to the magnetic sensor device 1 according to the present embodiment was used in the simulation. In the example model, all the first to third sensor coordinate systems were assumed to coincide with the reference coordinate system.

In the simulation, components Bx and By of magnetic flux densities at the resistor sections Rx1, Rx2, Rx3, Rx4, Ry1, Ry2, Ry3 and Ry4 when the first additional magnetic field was generated by the first magnetic field generator 71 were determined with the example model. The component Bx is a component in a direction parallel to the X direction. The component By is a component in a direction parallel to the Y direction. The currents Ixa and Ixb for generating the first additional magnetic field were directed to the directions shown in FIG. 20. The magnitudes of the currents Ixa and Ixb were each set at 1 mA.

In the simulation, the components Bx and By of the magnetic flux densities at the resistor sections Rx1, Rx2, Rx3, Rx4, Ry1, Ry2, Ry3 and Ry4 when the second additional magnetic field was generated by the second magnetic field generator 72 were also determined with the example model. The currents Iya and Iyb for generating the second additional magnetic field were directed to the directions shown in FIG. 22. The magnitudes of the currents Iya and Iyb were each set at 1 mA.

A half-bridge circuit formed by the resistor sections Rx1 and Rx2 will be denoted by the symbol Rx12. A half-bridge circuit formed by the resistor sections Rx3 and Rx4 will be denoted by the symbol Rx34. A half-bridge circuit formed by the resistor sections Ry1 and Ry2 will be denoted by the symbol Ry12. A half-bridge circuit formed by the resistor sections Ry3 and Ry4 will be denoted by the symbol Ry34. In the simulation, an average value of the magnetic flux densities at the resistor sections Rx1 and Rx2 was taken as the magnetic flux density at the half-bridge circuit Rx12, and an average value of the magnetic flux densities at the resistor sections Rx3 and Rx4 was taken as the magnetic flux density at the half-bridge circuit Rx34. An average value of the magnetic flux densities at the resistor sections Ry1 and Ry2 was taken as the magnetic flux density at the half-bridge circuit Ry12, and an average value of the magnetic flux densities at the resistor sections Ry3 and Ry4 was taken as the magnetic flux density at the half-bridge circuit Ry34.

The results of the simulation will now be described. The description first deals with the results in connection with the generation of the first additional magnetic field. Table 1 shows the magnetic flux densities at the resistor sections Rx1, Rx2, Rx3 and Rx4 and the half-bridge circuits Rx12 and Rx34 when the first additional magnetic field was generated. Table 2 shows the magnetic flux densities at the resistor sections Ry1, Ry2, Ry3 and Ry4 and the half-bridge circuits Ry12 and Ry34 when the first additional magnetic field was generated. Tables 1 and 2 show the magnitudes of the components Bx and By of the magnetic flux densities. In Tables 1 and 2, the component Bx in the X direction and the component By in the Y direction are expressed in positive values, while the component Bx in the −X direction and the component By in the −Y direction are expressed in negative values. In Tables 1 and 2, the magnetic flux densities are shown in values rounded off to one decimal place.

TABLE 1

|  | Bx (µT) | By (µT) |
| --- | --- | --- |
| Rx1 | 13.2 | 0.1 |
| Rx2 | 9.8 | −0.1 |
| Rx3 | 13.3 | 0.1 |
| Rx4 | 9.7 | −0.1 |

TABLE 1-continued

|  | Bx (μT) | By (μT) |
|---|---|---|
| Rx12 | 11.5 | 0.0 |
| Rx34 | 11.5 | 0.0 |

TABLE 2

|  | Bx (μT) | By (μT) |
|---|---|---|
| Ry1 | 6.0 | −0.2 |
| Ry2 | 6.0 | 0.1 |
| Ry3 | 6.0 | −0.2 |
| Ry4 | 6.0 | 0.1 |
| Ry12 | 6.0 | 0.0 |
| Ry34 | 6.0 | 0.0 |

The component Bx of a magnetic flux density corresponds to a magnetic field component in a direction parallel to the X direction. The component By of a magnetic flux density corresponds to a magnetic field component in a direction parallel to the Y direction. From the results shown in Tables 1 and 2, it can be seen that when the first additional magnetic field is generated by the first magnetic field generator 71, each of the first and second magnetic sensors 10 and 20 is subjected to the first additional magnetic field component, which is a component in a direction parallel to the X direction of the first additional magnetic field, and is subjected to no or hardly any component in a direction parallel to the Y direction of the first additional magnetic field. The results shown in Tables 1 and 2 also indicate that when the magnitudes of the currents Ixa and Ixb have a certain value, MF1a and MF1b are higher in strength than MF1c and MF1d.

Next, the description deals with the results in connection with the generation of the second additional magnetic field. Table 3 shows the magnetic flux densities at the resistor sections Rx1, Rx2, Rx3 and Rx4 and the half-bridge circuits Rx12 and Rx34 when the second additional magnetic field was generated. Table 4 shows the magnetic flux densities at the resistor sections Ry1, Ry2, Ry3 and Ry4 and the half-bridge circuits Ry12 and Ry34 when the second additional magnetic field was generated. Tables 3 and 4 show the magnitudes of the components Bx and By of the magnetic flux densities in the same manner as Tables 1 and 2. In Tables 1 and 2, the magnetic flux densities are shown in values rounded off to one decimal place.

TABLE 3

|  | Bx (μT) | By (μT) |
|---|---|---|
| Rx1 | 0.2 | 5.9 |
| Rx2 | −0.1 | 6.0 |
| Rx3 | 0.2 | 5.9 |
| Rx4 | −0.1 | 6.0 |
| Rx12 | 0.1 | 6.0 |
| Rx34 | 0.0 | 5.9 |

TABLE 4

|  | Bx (μT) | By (μT) |
|---|---|---|
| Ry1 | −0.1 | 12.9 |
| Ry2 | 0.1 | 9.5 |
| Ry3 | −0.1 | 12.9 |
| Ry4 | 0.1 | 9.5 |

TABLE 4-continued

|  | Bx (μT) | By (μT) |
|---|---|---|
| Ry12 | 0.0 | 11.2 |
| Ry34 | 0.0 | 11.2 |

From the results shown in Tables 3 and 4, it can be seen that when the second additional magnetic field is generated by the second magnetic field generator 72, each of the first and second magnetic sensors 10 and 20 is subjected to the second additional magnetic field component, which is a component in a direction parallel to the Y direction of the second additional magnetic field, and is subjected to no or hardly any component in a direction parallel to the X direction of the second additional magnetic field. The results shown in Tables 3 and 4 also indicate that when the magnitudes of the currents Iya and Iyb have a certain value, MF2c and MF2d are higher in strength than MF2a and MF2b.

The function and effect of the magnetic sensor device 1 according to the present embodiment will now be described. The first magnetic sensor 10 detects the first external magnetic field component, which is a component of an external magnetic field and is in the first sensing direction. The second magnetic sensor 20 detects the second external magnetic field component, which is a component of the external magnetic field and is in the second sensing direction. The third magnetic sensor 30 detects the third external magnetic field component, which is a component of the external magnetic field and is in the third sensing direction. The first sensing direction is a direction parallel to the X direction of the first sensor coordinate system. The second sensing direction is a direction parallel to the Y direction of the second sensor coordinate system. The third sensing direction is a direction parallel to the Z direction of the third sensor coordinate system.

A direction parallel to the first direction, i.e., a direction parallel to the X direction of the reference coordinate system will be referred to as a first main-axis direction. The ratio of a change in the first detection signal to a change in the strength of a magnetic field in the first main-axis direction will be referred to as a first main-axis sensitivity. The ratio of a change in the first detection signal to a change in the strength of a magnetic field in a direction other than the first main-axis direction will be referred to as a cross-axis sensitivity of the first magnetic sensor 10.

A direction parallel to the second direction, i.e., a direction parallel to the Y direction of the reference coordinate system will be referred to as a second main-axis direction. The ratio of a change in the second detection signal to a change in the strength of a magnetic field in the second main-axis direction will be referred to as a second main-axis sensitivity. The ratio of a change in the second detection signal to a change in the strength of a magnetic field in a direction other than the second main-axis direction will be referred to as a cross-axis sensitivity of the second magnetic sensor 20.

A direction parallel to the third direction, i.e., a direction parallel to the Z direction of the reference coordinate system will be referred to as a third main-axis direction. The ratio of a change in the third detection signal to a change in the strength of a magnetic field in the third main-axis direction will be referred to as a third main-axis sensitivity. The ratio of a change in the third detection signal to a change in the strength of a magnetic field in a direction other than the third main-axis direction will be referred to as a cross-axis sensitivity of the third magnetic sensor 30.

The magnetic sensor device 1 according to the present embodiment can measure the first to third main-axis sensitivities, the cross-axis sensitivity of the first magnetic sensor 10 in a direction parallel to the second direction, the cross-axis sensitivity of the second magnetic sensor 20 in a direction parallel to the first direction, the cross-axis sensitivity of the third magnetic sensor 30 in a direction parallel to the first direction, and the cross-axis sensitivity of the third magnetic sensor 30 in a direction parallel to the second direction in the following manner.

A method for measuring the first main-axis sensitivity and the cross-axis sensitivity of the first magnetic sensor 10 in a direction parallel to the second direction will be described first. The first magnetic sensor 10 is subjected to the first additional magnetic field component when the first additional magnetic field is generated by the first magnetic field generator 71. The first additional magnetic field component is a component of the first additional magnetic field and is in a direction parallel to the first direction, i.e., in the first main-axis direction. The control circuit in the integrated circuit chip 70 controls the first magnetic field generator 71 to change the strength of the first additional magnetic field component, and the correction processing circuit in the integrated circuit chip 70 obtains information concerning a change in the first detection signal when the strength of the first additional magnetic field component is changed. The correction processing circuit can thereby measure the first main-axis sensitivity.

The first magnetic sensor 10 is subjected to the second additional magnetic field component when the second additional magnetic field is generated by the second magnetic field generator 72. The second additional magnetic field component is a component of the second additional magnetic field and is in a direction parallel to the second direction. The control circuit controls the second magnetic field generator 72 to change the strength of the second additional magnetic field component, and the correction processing circuit obtains information concerning a change in the first detection signal when the strength of the second additional magnetic field component is changed. The correction processing circuit can thereby measure the cross-axis sensitivity of the first magnetic sensor 10 in the direction parallel to the second direction.

Next, a method for measuring the second main-axis sensitivity and the cross-axis sensitivity of the second magnetic sensor 20 in a direction parallel to the first direction will be described. The second magnetic sensor 20 is subjected to the second additional magnetic field component when the second additional magnetic field is generated by the second magnetic field generator 72. The second additional magnetic field component is a component of the second additional magnetic field and is in a direction parallel to the second direction, i.e., in the second main-axis direction. The control circuit controls the second magnetic field generator 72 to change the strength of the second additional magnetic field component, and the correction processing circuit obtains information concerning a change in the second detection signal when the strength of the second additional magnetic field component is changed. The correction processing circuit can thereby measure the second main-axis sensitivity.

The second magnetic sensor 20 is subjected to the first additional magnetic field component when the first additional magnetic field is generated by the first magnetic field generator 71. The control circuit controls the first magnetic field generator 71 to change the strength of the first additional magnetic field component, and the correction processing circuit obtains information concerning a change in the second detection signal when the strength of the first additional magnetic field component is changed. The correction processing circuit can thereby measure the cross-axis sensitivity of the second magnetic sensor 20 in the direction parallel to the first direction.

Next, a method for measuring the third main-axis sensitivity, the cross-axis sensitivity of the third magnetic sensor 30 in a direction parallel to the first direction, and the cross-axis sensitivity of the third magnetic sensor 30 in a direction parallel to the second direction will be described. The third magnetic sensor 30 is subjected to the third additional magnetic field component when the third additional magnetic field is generated by the third magnetic field generator 73. The third additional magnetic field component is a component of the third additional magnetic field and is in a direction parallel to the third direction, i.e., in the third main-axis direction. The control circuit controls the third magnetic field generator 73 to change the strength of the third additional magnetic field component, and the correction processing circuit obtains information concerning a change in the third detection signal when the strength of the third additional magnetic field component is changed. The correction processing circuit can thereby measure the third main-axis sensitivity.

The third magnetic sensor 30 is subjected to the first additional magnetic field component when the first additional magnetic field is generated by the first magnetic field generator 71. The control circuit controls the first magnetic field generator 71 to change the strength of the first additional magnetic field component, and the correction processing circuit obtains information concerning a change in the third detection signal when the strength of the first additional magnetic field component is changed. The correction processing circuit can thereby measure the cross-axis sensitivity of the third magnetic sensor 30 in the direction parallel to the first direction.

The third magnetic sensor 30 is subjected to the second additional magnetic field component when the second additional magnetic field is generated by the second magnetic field generator 72. The control circuit controls the second magnetic field generator 72 to change the strength of the second additional magnetic field component, and the correction processing circuit obtains information concerning a change in the third detection signal when the strength of the second additional magnetic field component is changed. The correction processing circuit can thereby measure the cross-axis sensitivity of the third magnetic sensor 30 in the direction parallel to the second direction.

In the present embodiment, the reference coordinate system is set with reference to the composite chip component 3. The composite chip component 3 is integrated with the first to third magnetic field generators 71, 72 and 73. In the present embodiment, specifically, the first to third magnetic field generators 71, 72 and 73 are included in the composite chip component 3. This prevents misalignment of the first to third magnetic field generators 71, 72, and 73 with respect to the reference coordinate system. The respective directions of the first to third additional magnetic field components are thus precisely defined in the reference coordinate system. According to the present embodiment, the first to third main-axis sensitivities and the foregoing four cross-axis sensitivities can thus be measured with high precision.

As described above, the magnetic sensor device 1 is designed so that the first to third sensor coordinate systems coincide with the reference coordinate system. However, at least one of the first to third sensor coordinate systems can deviate from the reference coordinate system due to reasons such as misalignment of the sensor chip 4 with the composite chip component 3 or misalignment between the first to third magnetic sensors 10, 20 and 30. Even in such a case, according to the present embodiment, the first to third detection signals can be corrected by using the first to third main-axis sensitivities and the foregoing four cross-axis sensitivities, which are measured by using a magnetic field referenced to the reference coordinate system, that is, the first to third additional magnetic field components. This makes it possible to convert the first to third detection signals into detection signals referenced to the reference coordinate system.

In the present embodiment, when the third additional magnetic field is generated by the third magnetic field generator 73, neither of the first and second magnetic sensors 10 and 20 is subjected to any third additional magnetic field component. Thus, in the present embodiment it is not possible to measure the cross-axis sensitivity of the first magnetic sensor 10 in a direction parallel to the third direction or the cross-axis sensitivity of the second magnetic sensor 20 in a direction parallel to the third direction. In the present embodiment, however, both of the foregoing two cross-axis sensitivities can safely be regarded as zero for the following first and second reasons. The first reason is that the first and second magnetic sensors 10 and 20 are originally low in sensitivity in a direction parallel to the Z direction of their respective sensor coordinate systems. The second reason is that the magnetic sensor device 1 structurally causes no or little tilt of the Z direction of the first and second sensor coordinate systems with respect to the Z direction of the reference coordinate system.

Next, a brief description will be given of the correction processing to be performed on the first to third detection signals by the correction processing circuit in the integrated circuit chip 70.

First, an ideal state is defined by the following first to third requirements. The first requirement is that the first sensing direction must coincide with a direction parallel to the first direction, the second sensing direction must coincide with a direction parallel to the second direction, and the third sensing direction must coincide with a direction parallel to the third direction.

The second requirement is that the ratio of a change in the first detection signal to a change in the first external magnetic field component, the ratio of a change in the second detection signal to a change in the second external magnetic field component, and the ratio of a change in the third detection signal to a change in the third external magnetic field component must be equal.

The third requirement is that the ratio of a change in the second detection signal to a change in the first external magnetic field component, the ratio of a change in the third detection signal to a change in the first external magnetic field component, the ratio of a change in the first detection signal to a change in the second external magnetic field component, the ratio of a change in the third detection signal to a change in the second external magnetic field component, the ratio of a change in the first detection signal to a change in the third external magnetic field component, and the ratio of a change in the second detection signal to a change in the third external magnetic field component must all be zero.

Here, the first detection signal in the ideal state will be referred to as a first ideal signal, the second detection signal in the ideal state as a second ideal signal, and the third detection signal in the ideal state as a third ideal signal. The correction processing is processing to correct the first to third detection signals and thereby generate first to third corrected signals so that the first to third corrected signals are closer to the first to third ideal signals, compared to the uncorrected first to third detection signals.

An example of the first corrected signal is the sum of three terms obtained by multiplying the uncorrected first to third detection signals by first to third correction coefficients, respectively. Similarly, an example of the second corrected signal is the sum of three terms obtained by multiplying the uncorrected first to third detection signals by fourth to sixth correction coefficients, respectively. Similarly, an example of the third corrected signal is the sum of three terms obtained by multiplying the uncorrected first to third detection signals by seventh to ninth correction coefficients, respectively. In the present embodiment, the third and sixth correction coefficients are zero. The other correction coefficients are computed on the basis of the first to third main-axis sensitivities and the foregoing fourth cross-axis sensitivities.

First to Fourth Modification Examples

First to fourth modification examples of the magnetic sensor device 1 according to the present embodiment will now be described. The first modification example will be described first. The first modification example is an example configured to be operable to simultaneously drive two or three of the first to third magnetic field generators 71, 72 and 73, as well as to drive the first to third magnetic field generators 71, 72 and 73 independently of each other. The first modification example thus enables generation of a magnetic field in any direction at a predetermined position in a predetermined plane that is parallel to the XY plane of the reference coordinate system and intersects the sensor chip 4. Such a magnetic field will hereinafter be referred to as a variable direction magnetic field. When two or three of the first to third magnetic field generators 71, 72 and 73 are simultaneously driven, the two or more additional magnetic fields generated by them are combined to form the variable direction magnetic field.

For example, an operation to drive the first and second magnetic field generators 71 and 72 independently of each other and an operation to simultaneously drive the first and second magnetic field generators 71 and 72 can be combined to set the direction of the variable direction magnetic field to any direction parallel to the XY plane of the reference coordinate system. Hereinafter, the variable direction magnetic field in any direction parallel to the XY plane of the reference coordinate system will be referred to as a rotating magnetic field MFr, in particular. Furthermore, by simultaneously driving at least either one of the first and second magnetic field generators 71 and 72 and the third magnetic field generator 73, the direction of the variable direction magnetic field can be set to any direction other than a direction parallel to the XY plane of the reference coordinate system.

According to the first modification example, a magnetic field in any direction can be applied to a magnetic sensor by arranging the magnetic sensor at the foregoing predetermined position. This makes it possible to change, for example, the reference coordinate system in measuring the main- and cross-axis sensitivities of the magnetic sensor.

Several examples of the method for setting the direction of the rotating magnetic field MFr will be described below. In the following description, the angle that the direction of the rotating magnetic field NFr forms with respect to the X direction of the reference coordinate system will be referred to as a rotating field angle. To set the rotating field angle at 0°, for example, as shown in FIG. 20, the direction of the current Ixa is set to be clockwise as viewed from above, the direction of the current Ixb is set to be counterclockwise as viewed from above, and the magnitudes of the currents Iya and Iyb are set at 0. To set the rotating field angle at 90°, for example, as shown in FIG. 22, the direction of the current Iya is set to be clockwise as viewed from above, the direction of the current Iyb is set to be counterclockwise as viewed from above, and the magnitudes of the currents Ixa and Ixb are set at 0.

Figure 24:
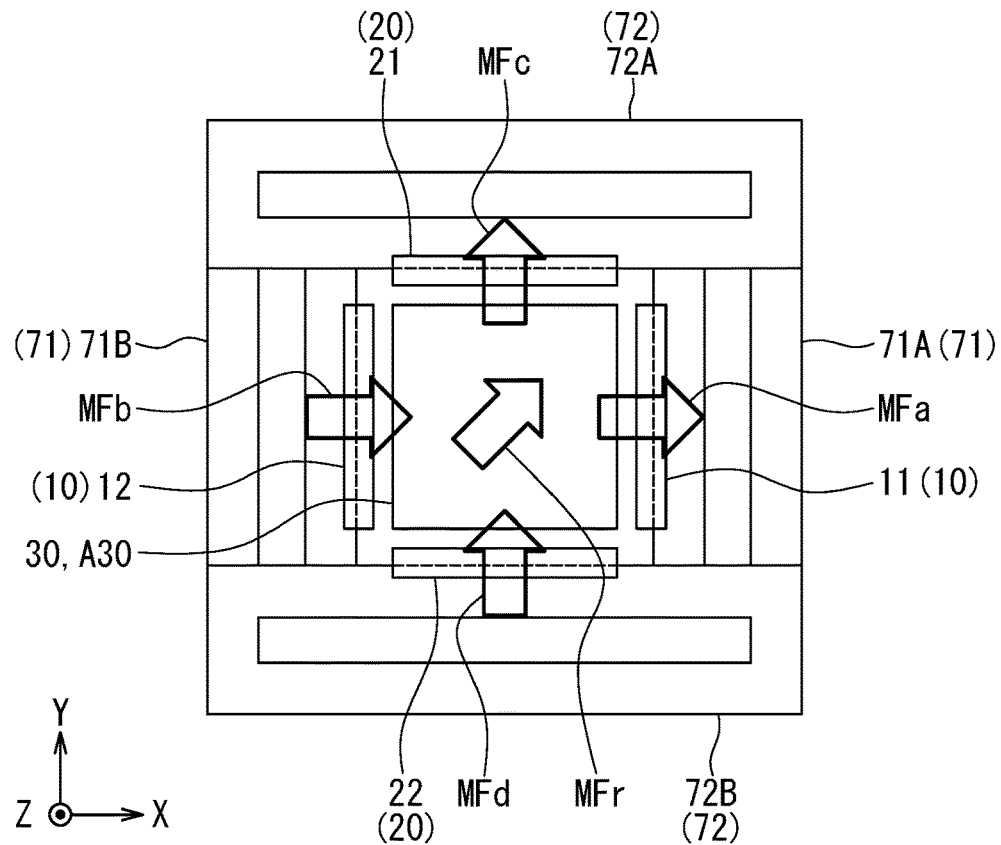
FIG. 24 is an explanatory diagram for describing a first modification example of the magnetic sensor device according to the first embodiment of the invention.

To set the rotating field angle at 45°, for example, the directions of the currents Ixa and Iya are set to be clockwise as viewed from above, the directions of the currents Ixb and Iyb are set to be counterclockwise as viewed from above, and both of the ratio of the magnitude of the current Iya to the magnitude of the current Ixa and the ratio of the magnitude of the current Iyb to the magnitude of the current Ixb are set at 1. In FIG. 24, the arrows designated by the symbols MFa, MFb, MFc, MFd, and MFr respectively indicate the directions of magnetic fields MFa, MFb, MFc, MFd, and MFr in the case of setting the rotating field angle at 45°.

To set the rotating field angle at 30°, for example, the directions of the currents Ixa and Iya are set to be clockwise as viewed from above, the directions of the currents Ixb and Iyb are set to be counterclockwise as viewed from above, and both of the ratio of the magnitude of the current Iya to the magnitude of the current Ixa and the ratio of the magnitude of the current Iyb to the magnitude of the current Ixb are set at $1/\sqrt{3}$.

To set the rotating field angle at 180°, the direction of the current Ixa is set to be counterclockwise as viewed from above, the direction of the current Ixb is set to be clockwise as viewed from above, and the magnitudes of the currents Iya and Iyb are set at 0. To set the rotating field angle at 270°, for example, the direction of the current Iya is set to be counterclockwise as viewed from above, the direction of the current Iyb is set to be clockwise as viewed from above, and the magnitudes of the currents Ixa and Ixb are set at 0.

Figure 25:
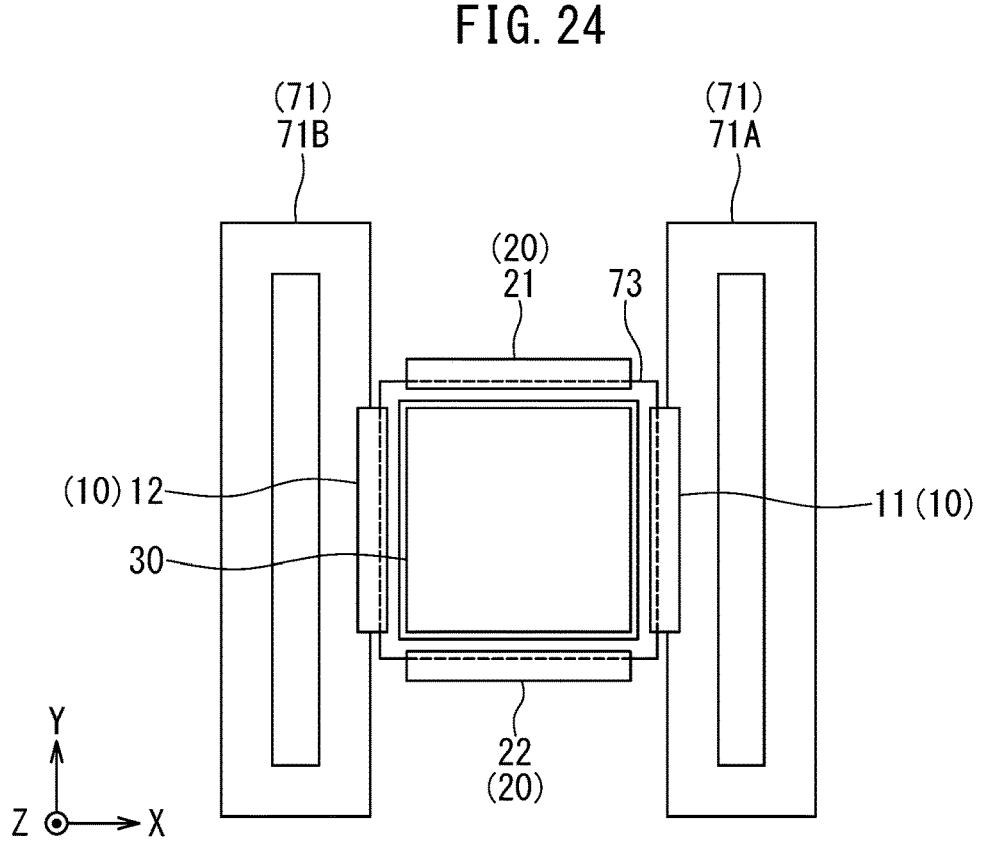
FIG. 25 is a plan view showing the first magnetic field generator and the third magnetic field generator in a second modification example of the first embodiment of the invention.

Next, the second modification example will be described with reference to FIGS. 5, 6, and 25. FIG. 25 is a plan view showing the first magnetic field generator 71 and the third magnetic field generator 73. In the second modification example, the first and second coils 71A and 71B of the first magnetic field generator 71 and the third magnetic field generator 73 are arranged on the same plane, such as the top surface 70a of the integrated circuit chip 70. The first coil 71A is located forward of the third magnetic field generator 73 in the X direction of the reference coordinate system. The second coil 71B is located forward of the third magnetic field generator 73 in the −X direction of the reference coordinate system.

In the second modification example, the insulating layers 74C and 74D are omitted. The insulating layer 74A lies on the top surface 70a and surrounds the coils 71A and 71B and the third magnetic field generator 73. The insulating layer 74B covers the coils 71A and 71B, the third magnetic field generator 73, and the insulating layer 74A. The third and fourth coils 72A and 72B of the second magnetic field generator 72 and the insulating layer 74E are arranged on the insulating layer 74B.

The second modification example reduces the dimension of the composite chip component 3 (see, for example, FIG. 1) in the Z direction as much as the insulating layers 74C and 74D, as compared to the example shown in FIGS. 5 and 6.

Figure 26:
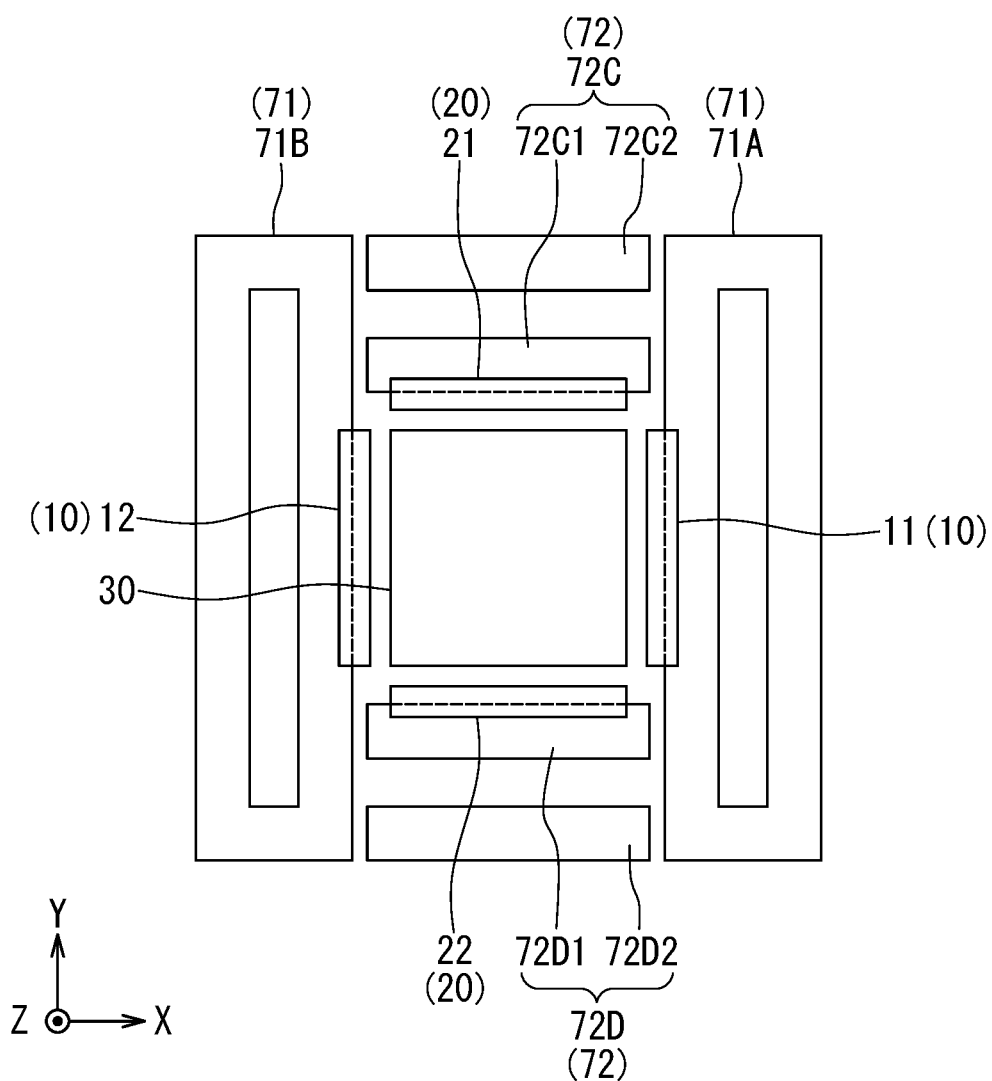
FIG. 26 is a plan view showing the first magnetic field generator and a portion of the second magnetic field generator in a third modification example of the first embodiment of the invention.
Figure 27:
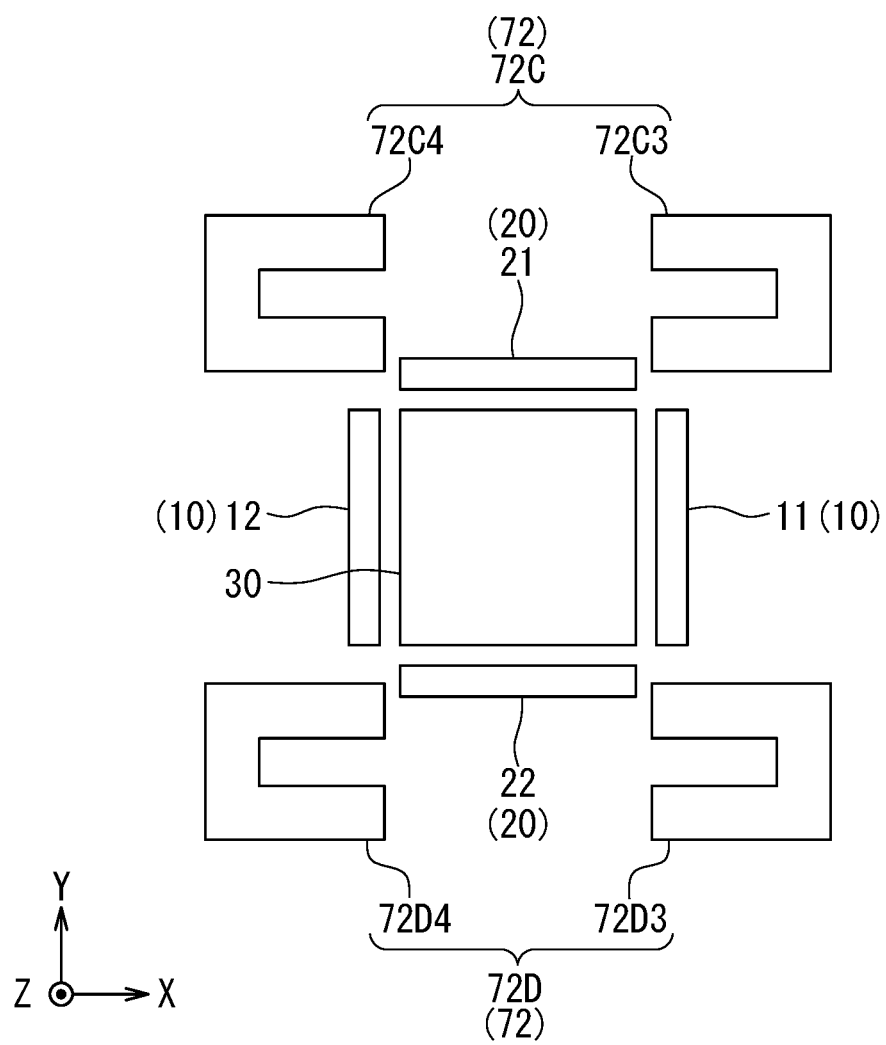
FIG. 27 is a plan view showing another portion of the second magnetic field generator in the third modification example of the first embodiment of the invention.

Next, the third modification example will be described with reference to FIGS. 26 and 27. FIG. 26 is a plan view showing the first magnetic field generator 71 and a portion of the second magnetic field generator 72. FIG. 27 is a plan view showing another portion of the second magnetic field generator 72. In the third modification example, the second magnetic field generator 72 includes a third coil 72C and a fourth coil 72D in place of the third and fourth coils 72A and 72B.

As viewed from above, the shape and location of the third coil 72C are the same as those of the third coil 72A. The third coil 72C includes two coil portions 72C1 and 72C2 located on the same plane as the first and second coils 71A and 71B, and two coil portions 72C3 and 72C4 located at different positions from those of the coil portions 72C1 and 72C2 in a direction perpendicular to the reference plane RP (see FIG. 1). The coil portions 72C1 and 72C2 are interposed between the first and second coils 71A and 71B, and located at different positions from each other in the Y direction of the reference coordinate system. The coil portions 72C3 and 72C4 are located at different positions from each other in the X direction of the reference coordinate system.

Each of the coil portions 72C1 to 72C4 includes a plurality of conductor portions. As viewed from above, part of the plurality of conductor portions of the coil portion 72C3 overlaps part of the plurality of conductor portions of the coil portion 72C1 and part of the plurality of conductor portions of the coil portion 72C2. As viewed from above, part of the plurality of conductor portions of the coil portion 72C4 overlaps another part of the plurality of conductor portions of the coil portion 72C1 and another part of the plurality of conductor portions of the coil portion 72C2. The parts of the plurality of conductor portions that overlap each other as viewed from above are connected by, for example, a plurality of through holes in such a manner as to form a single piece of conductor wound a plurality of turns in a flat spiral shape along the XY plane of the reference coordinate system.

As viewed from above, the shape and location of the fourth coil 72D are the same as those of the fourth coil 72B. The fourth coil 72D includes two coil portions 72D1 and 72D2 located on the same plane as the first and second coils 71A and 71B, and two coil portions 72D3 and 72D4 located at different positions from those of the coil portions 72D1 and 72D2 in a direction perpendicular to the reference plane RP (see FIG. 1). The coil portions 72D1 and 72D2 are interposed between the first and second coils 71A and 71B, and located at different positions from each other in the Y direction of the reference coordinate system. The coil portions 72D3 and 72D4 are located at different positions from each other in the X direction of the reference coordinate system.

Each of the coil portions 72D1 to 72D4 includes a plurality of conductor portions. As viewed from above, part of the plurality of conductor portions of the coil portion 72D3 overlaps part of the plurality of conductor portions of the coil portion 72D1 and part of the plurality of conductor portions of the coil portion 72D2. As viewed from above, part of the plurality of conductor portions of the coil portion 72D4 overlaps another part of the plurality of conductor portions of the coil portion 72D1 and another part of the plurality of conductor portions of the coil portion 72D2. The parts of the plurality of conductor portions that overlap each other as viewed from above are connected by, for example, a plurality of through holes in such a manner as to form a single piece of conductor wound a plurality of turns in a flat spiral shape along the XY plane of the reference coordinate system.

Now, a description will be given of a positional relationship between the third and fourth coils 72C, 72D and the insulating layers 74B, 74C, 74D, 74E, 74F (see FIGS. 5 and 6). The coil portions 72C1, 72C2, 72D1, and 72D2 are located on the insulating layer 74B. The insulating layer 74C lies on the insulating layer 74B and surrounds the coils 71A and 71B and the coil portions 72C1, 72C2, 72D1 and 72D2. The insulating layer 74D covers the coils 71A and 71B, the coil portions 72C1, 72C2, 72D1 and 72D2, and the insulating layer 74C. The coil portions 72C3, 72C4, 72D3 and 72D4 are located on the insulating layer 74D. The aforementioned through holes are embedded in the insulating layer 74D. The insulating layer 74E lies on the insulating layer 74D and surrounds the coil portions 72C3, 72C4, 72D3 and 72D4. The insulating layer 74F covers the coil portions 72C3, 72C4, 72D3 and 72D4 and the insulating layer 74F.

Second Embodiment

Figure 28:
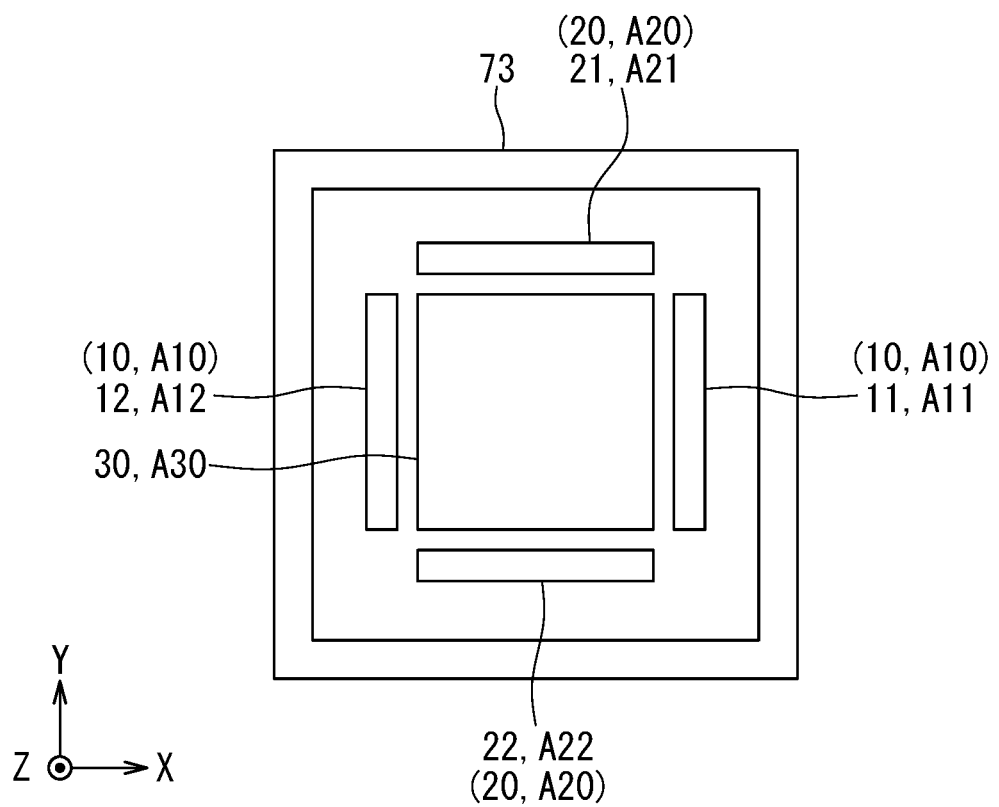
FIG. 28 is a plan view showing the third magnetic field generator of a second embodiment of the invention.

A second embodiment of the present invention will now be described. First, reference is made to FIG. 28 to describe the differences in configuration of the magnetic sensor device 1 according to the second embodiment from that according to the first embodiment. FIG. 28 is a plan view showing the third magnetic field generator of the second embodiment. As viewed from above, the third magnetic field generator 73 has outer and inner peripheries of square or almost square shape. In the present embodiment, as viewed from above, the third magnetic field generator 73 surrounds the first to fourth partial areas A11, A12, A21 and A22.

Although not shown, the first and second magnetic field generators 71 and 72 are configured, shaped and located in the same manner as in the first embodiment.

Next, the function and effect of the third additional magnetic field generated by the third magnetic field generator 73 will be described with reference to FIG. 28. In the present embodiment, when the third additional magnetic field is generated by the third magnetic field generator 73, the first to third magnetic sensors 10, 20 and 30 are each subjected to a third additional magnetic field component. The third additional magnetic field component is a component of the third additional magnetic field and is in a direction parallel to the third direction, i.e., parallel to the Z direction of the reference coordinate system.

In the present embodiment, the control circuit in the integrated circuit chip 70 (see, for example, FIG. 2) controls the third magnetic field generator 73 to change the strength of the third additional magnetic field component, and the correction processing circuit in the integrated circuit chip 70 obtains information concerning a change in the first detection signal when the strength of the third additional magnetic field component is changed. The correction processing circuit can thereby measure the cross-axis sensitivity of the first magnetic sensor 10 in a direction parallel to the third direction.

Similarly, the correction processing circuit obtains information concerning a change in the second detection signal when the control circuit controls the third magnetic field generator 73 to change the strength of the third additional magnetic field component. The correction processing circuit can thereby measure the cross-axis sensitivity of the second magnetic sensor 20 in a direction parallel to the third direction.

As has been described in relation to the first embodiment, the direction of the third additional magnetic field component is precisely defined in the reference coordinate system. According to the present embodiment, the foregoing two cross-axis sensitivities can thus be measured with high precision.

Further, as has been described in relation to the first embodiment, the first to ninth correction coefficients are used in the correction processing to be performed on the first to third detection signals by the correction processing circuit. In the present embodiment, the first to ninth correction coefficients are computed on the basis of the measurement results of the foregoing two cross-axis sensitivities, and the measurement results of the first to third main-axis sensitivities and the four cross-axis sensitivities described in relation to the first embodiment.

First to Third Modification Examples

Figure 29:
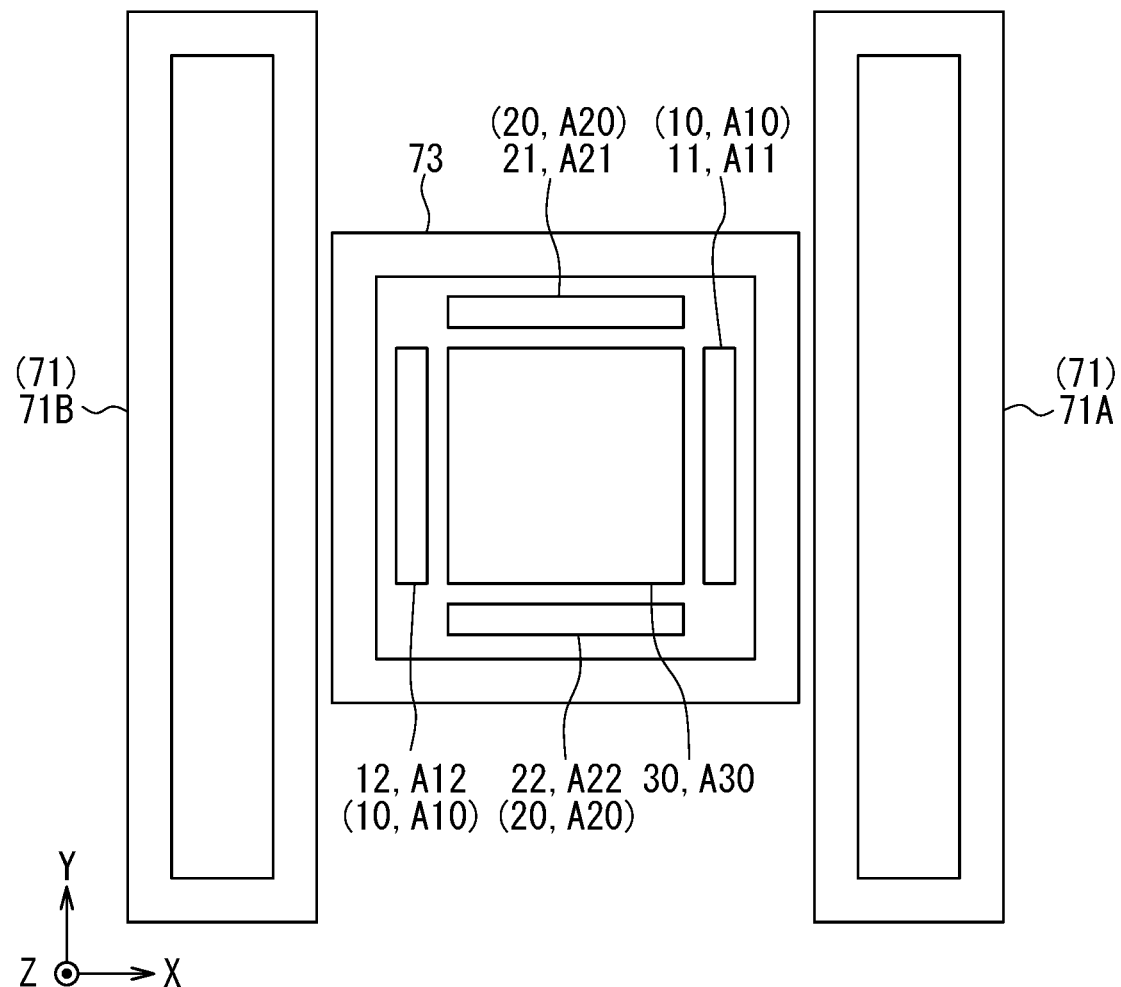
FIG. 29 is a plan view showing the first magnetic field generator and the third magnetic field generator in a first modification example of the second embodiment of the invention.
Figure 30:
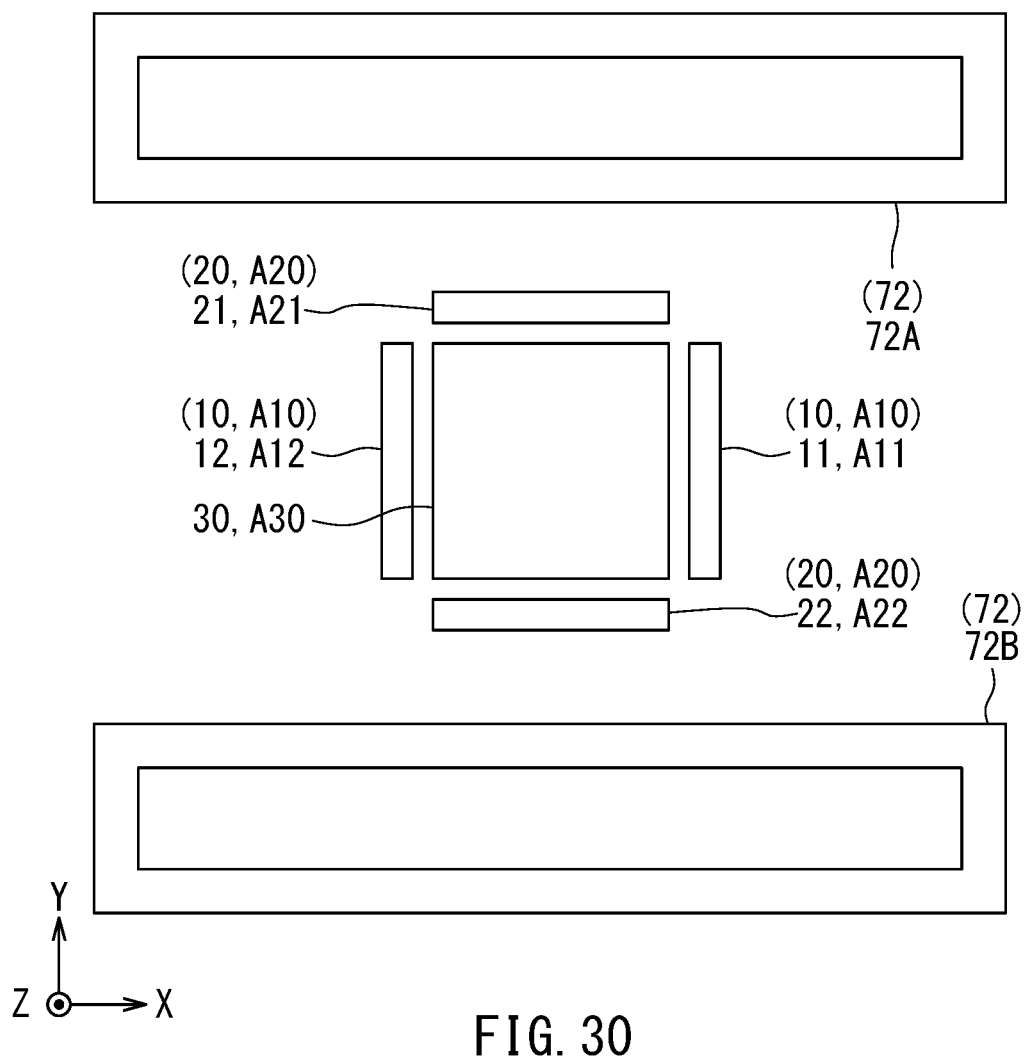
FIG. 30 is a plan view showing the second magnetic field generator in the first modification example of the second embodiment of the invention.

First to third modification examples of the magnetic sensor device 1 according to the present embodiment will now be described. First, reference is made to FIGS. 29 and 30 to describe the first modification example. FIG. 29 is a plan view showing the first magnetic field generator 71 and the third magnetic field generator 73. FIG. 30 is a plan view showing the second magnetic field generator 72. In the first modification example, the first and second coils 71A and 71B of the first magnetic field generator 71 and the third magnetic field generator 73 are arranged on the same plane, such as the top surface 70a (see FIGS. 5 and 6) of the integrated circuit chip 70. In the example shown in FIG. 29, the third magnetic field generator 73 is smaller in dimensions in the X and Y directions than in the example shown in FIG. 28.

As shown in FIG. 29, the first coil 71A is located forward of the third magnetic field generator 73 in the X direction of the reference coordinate system. The first coil 71A is greater in dimensions in the X and Y directions than the first coil 71A of the first embodiment shown in, for example, FIG. 4.

As shown in FIG. 29, the second coil 71B is located forward of the third magnetic field generator 73 in the −X direction of the reference coordinate system. The second coil 71B is greater in dimensions in the X and Y directions than the second coil 71B of the first embodiment shown in, for example, FIG. 4.

As shown in FIG. 30, the third coil 72A of the second magnetic field generator 72 as viewed from above is located forward of the third magnetic field generator 73 in the Y direction of the reference coordinate system. The third coil 72A is greater in dimensions in the X and Y directions than the third coil 72A of the first embodiment shown in, for example, FIG. 4.

As shown in FIG. 30, the fourth coil 72B of the second magnetic field generator 72 as viewed from above is located forward of the third magnetic field generator 73 in the −Y direction of the reference coordinate system. The fourth coil 72B is greater in dimensions in the X and Y directions than the fourth coil 72B of the first embodiment shown in, for example, FIG. 4.

Now, a description will be given of a positional relationship of the first to third magnetic field generators 71 to 73 with the insulating layers 74A to 74E of the first embodiment shown in FIGS. 5 and 6. In the first modification example, the insulating layers 74C and 74D are omitted. The insulating layer 74A lies on the top surface 70a of the integrated circuit chip 70 and surrounds the coils 71A and 71B and the third magnetic field generator 73. The insulating layer 74B covers the coils 71A and 71B, the third magnetic field generator 73, and the insulating layer 74A. The third and fourth coils 72A and 72B of the second magnetic field generator 72 and the insulating layer 74E are located on the insulating layer 74B.

The first modification example reduces the dimension of the composite chip component 3 (see, for example, FIG. 1) in the Z direction as much as the insulating layers 74C and 74D, as compared to the example shown in FIGS. 5 and 6.

Figure 31:
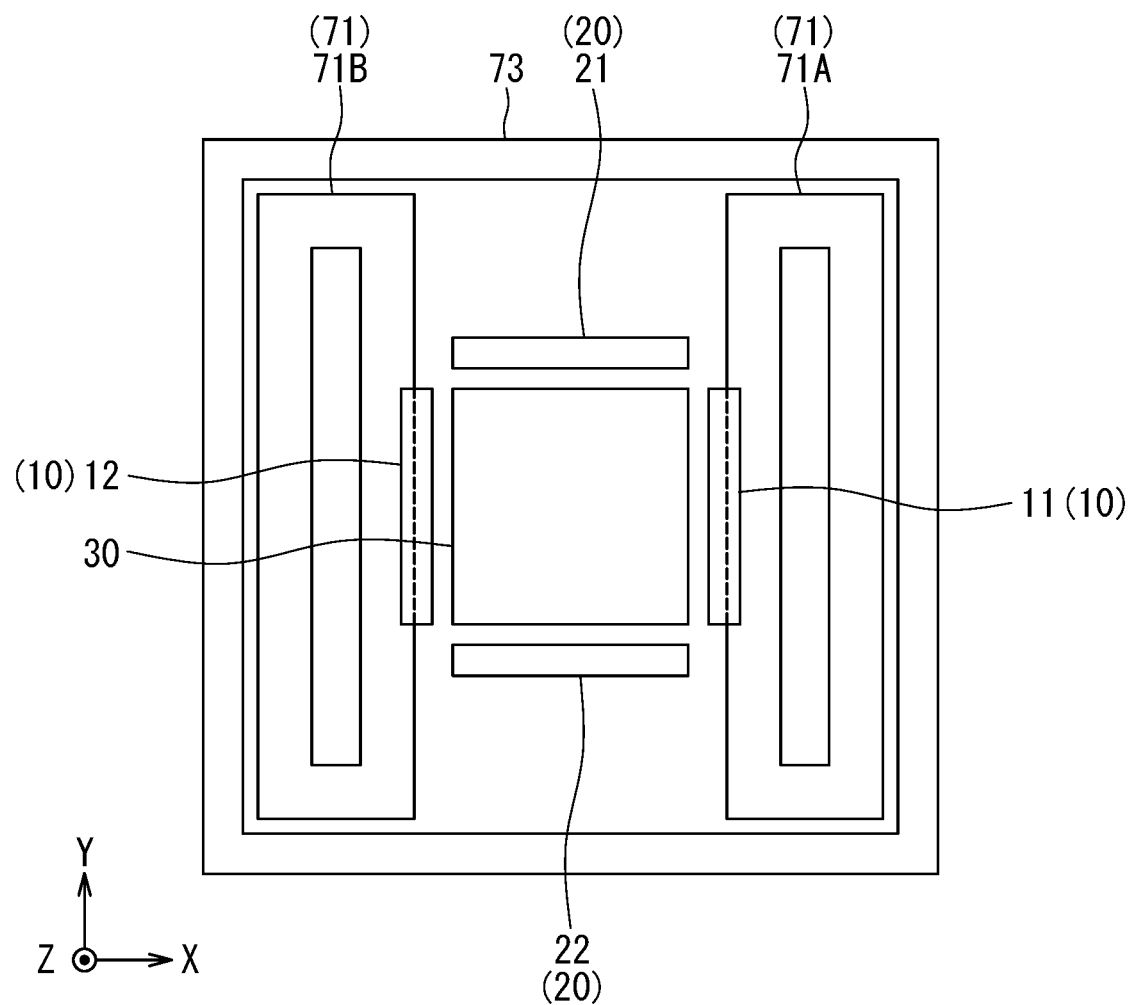
FIG. 31 is a plan view showing the first magnetic field generator and the third magnetic field generator in a second modification example of the second embodiment of the invention.

Next, the second modification example will be described with reference to FIG. 31. FIG. 31 is a plan view showing the first magnetic field generator 71 and the third magnetic field generator 73. The second modification example differs from the first modification example in the following ways. In the second modification example, the first and second coils 71A and 71B of the first magnetic field generator 71 and the third magnetic field generator 73 are arranged on the same plane, as in the first modification example. However, the third magnetic field generator 73 surrounds the first and second coils 71A and 71B as viewed from above.

Further, although not shown, the third and fourth coils 72A and 72B of the second magnetic field generator 72, as viewed from above, are located inside the inner periphery of the fifth coil constituting the third magnetic field generator 73.

Figure 32:
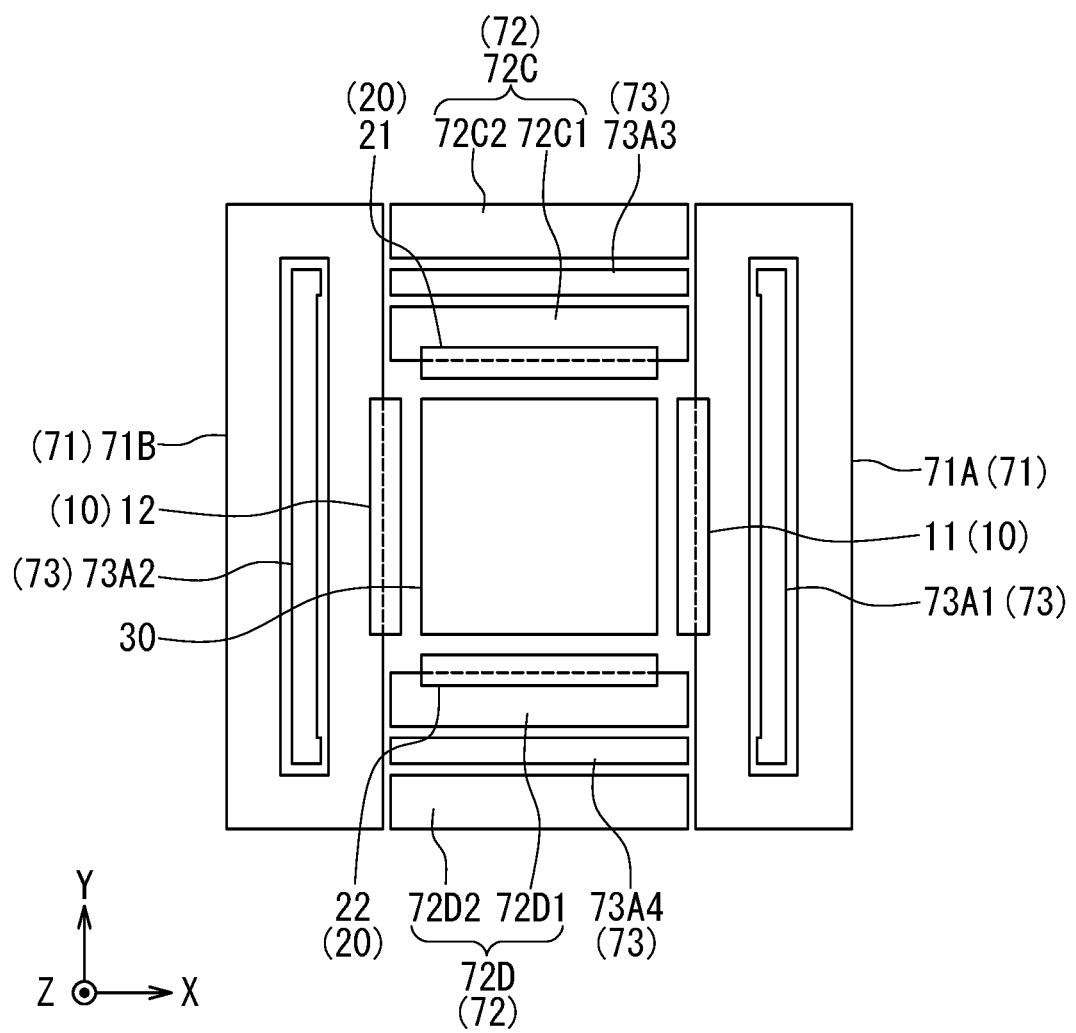
FIG. 32 is a plan view showing the first magnetic field generator, a portion of the second magnetic field generator, and a portion of the third magnetic field generator in a third modification example of the second embodiment of the invention.
Figure 33:
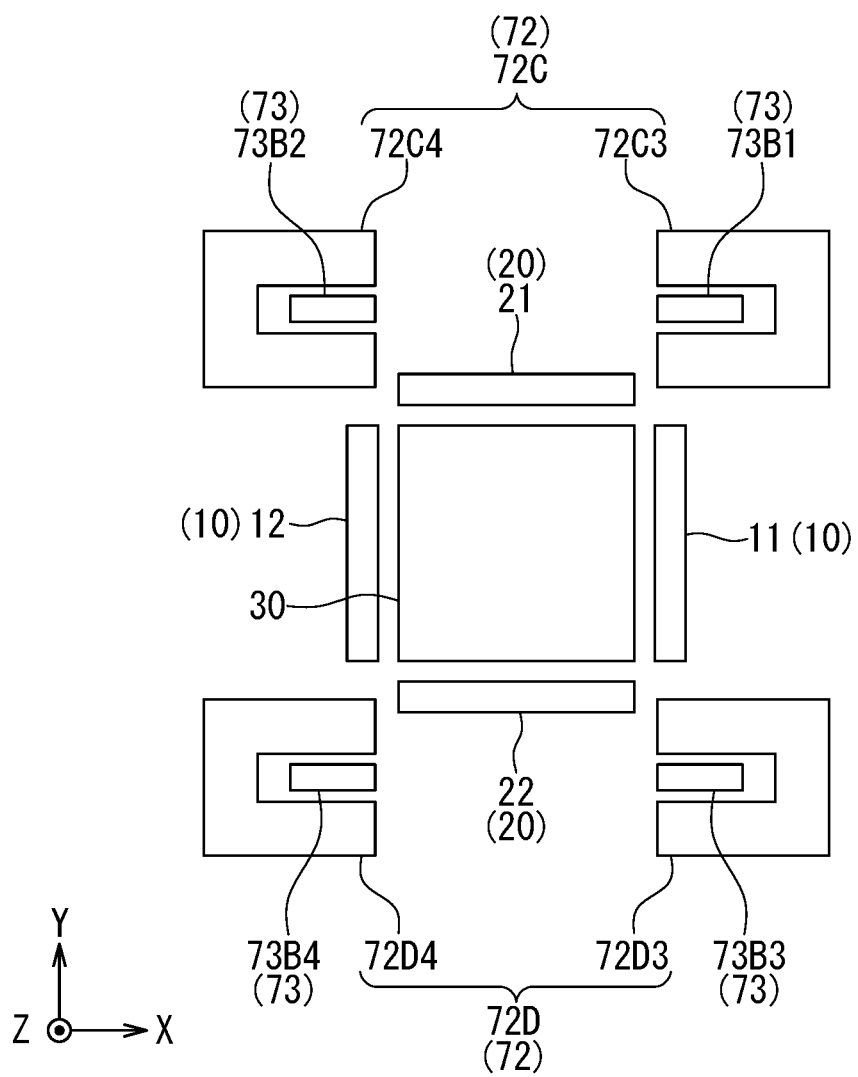
FIG. 33 is a plan view showing another portion of the second magnetic field generator and another portion of the third magnetic field generator in the third modification example of the second embodiment of the invention.

Next, the third modification example will be described with reference to FIGS. 32 and 33. FIG. 32 is a plan view showing the first magnetic field generator 71, a portion of the second magnetic field generator 72, and a portion of the third magnetic field generator 73. FIG. 33 is a plan view showing another portion of the second magnetic field generator 72 and another portion of the third magnetic field generator 73. In the third modification example, the second magnetic field generator 72 includes the third coil 72C and the fourth coil 72D described in relation to the third modification example of the first embodiment, in place of the third and fourth coils 72A and 72B. The third coil 72C includes the coil portions 72C1, 72C2, 73C3 and 72C4. The fourth coil 72D includes the coil portions 72D1, 72D2, 72D3 and 73D4.

The fifth coil constituting the third magnetic field generator 73 includes four coil portions 73A1, 73A2, 73A3 and 73A4 arranged on the same plane as the first and second coils 71A and 71B of the first magnetic field generator 71, the coil portions 72C1 and 72C2 of the third coil 72C, and the coil portions 72D1 and 72D2 of the fourth coil 72D. The fifth coil further includes four coil portions 73B1, 73B2, 73B3 and 73B4 arranged at different positions from the coil portions 73A1 to 73A4 in a direction perpendicular to the reference plane RP (seen FIG. 1). The coils 71A and 71B and the coil portions 72C1, 72C2, 72D1, 72D2 and 73A1 to 73A4 are arranged on the top surface 70a (see FIGS. 5 and 6) of the integrated circuit chip 70, for example.

The coil portion 73A1 is located in a hollow portion inside the inner periphery of the first coil 71A. The coil portion 73A2 is located in a hollow portion inside the inner periphery of the second coil 71B. The coil portion 73A3 is located between the coil portions 72C1 and 72C2 in a hollow portion inside the inner periphery of the third coil 72C. The coil portion 73A4 is located between the coil portions 72D1 and 72D2 in a hollow portion inside the inner periphery of the fourth coil 72D.

The coil portion 73B1 is located in a part of the hollow portion inside the inner periphery of the third coil 72C, the part surrounded by the coil portion 73C3. The coil portion 73B2 is located in a part of the hollow portion inside the inner periphery of the third coil 72C, the part surrounded by the coil portion 73C4. The coil portion 73B3 is located in a part of the hollow portion inside the inner periphery of the fourth coil 72D, the part surrounded by the coil portion 73D3. The coil portion 73B4 is located in a part of the hollow portion inside the inner periphery of the fourth coil 72D, the part surrounded by the coil portion 73D4.

Each of the coil portions 73A1 to 73A4 and 73B1 to 73B4 includes a plurality of conductor portions. As viewed from above, part of the plurality of conductor portions of the coil portion 73B1 overlaps part of the plurality of conductor portions of the coil portion 73A1 and part of the plurality of conductor portions of the coil portion 73A3. As viewed from above, part of the plurality of conductor portions of the coil portion 73B2 overlaps part of the plurality of conductor portions of the coil portion 73A2 and part of the plurality of conductor portions of the coil portion 73A3. As viewed from above, part of the plurality of conductor portions of the coil portion 73B3 overlaps part of the plurality of conductor portions of the coil portion 73A1 and part of the plurality of conductor portions of the coil portion 73A4. As viewed from above, part of the plurality of conductor portions of the coil portion 73B4 overlaps part of the plurality of conductor portions of the coil portion 73A2 and part of the plurality of conductor portions of the coil portion 73A4. The parts of the plurality of conductor portions that overlap each other as viewed from above are connected by, for example, a plurality of through holes in such a manner as to form a single piece of conductor wound a plurality of turns in a flat spiral shape along the XY plane of the reference coordinate system.

Now, a description will be given of a positional relationship of the first to third magnetic field generators 71 to 73 with the insulating layers 74A to 74E of the first embodiment shown in FIGS. 5 and 6. In the third modification example, the insulating layers 74C and 74D are omitted. The insulating layer 74A lies on the top surface 70a of the integrated circuit chip 70 and surrounds the coils 71A and 71B and the coil portions 72C1, 72C2, 72D1, 72D2 and 73A1 to 73A4. The insulating layer 74B covers the coils 71A and 71B, the coil portions 72C1, 72C2, 72D1, 72D2 and 73A1 to 73A4 and the insulating layer 74A. The coil portions 72C3, 72C4, 72D3, 72D4 and 73B1 to 73B4 are arranged on the insulating layer 74B. The insulating layer 74E lies on the insulating layer 74B and surrounds the coil portions 72C3, 72C4, 72D3, 72D4 and 73B1 to 73B4. The insulating layer 74F covers the coil portions 72C3, 72C4, 72D3, 72D4 and 73B1 to 73B4 and the insulating layer 74E.

The third modification example reduces the dimension of the composite chip component 3 (see, for example, FIG. 1) in the Z direction as much as the insulating layers 74C and 74D, as compared to the example shown in FIGS. 5 and 6.

The configuration, function and effects of the present embodiment are otherwise the same as those of the first embodiment.

Third Embodiment

A third embodiment of the present invention will now be described. First, a description will be given of the differences in configuration of the magnetic sensor device 1 according to the third embodiment from that according to the first embodiment. In the third embodiment, the third magnetic field generator 73 and the insulating layers 74A and 74B of the first embodiment are omitted. The first magnetic field generator 71 and the insulating layer 74C are disposed on the top surface 70a (see FIGS. 5 and 6) of the integrated circuit chip 70.

Figure 34:
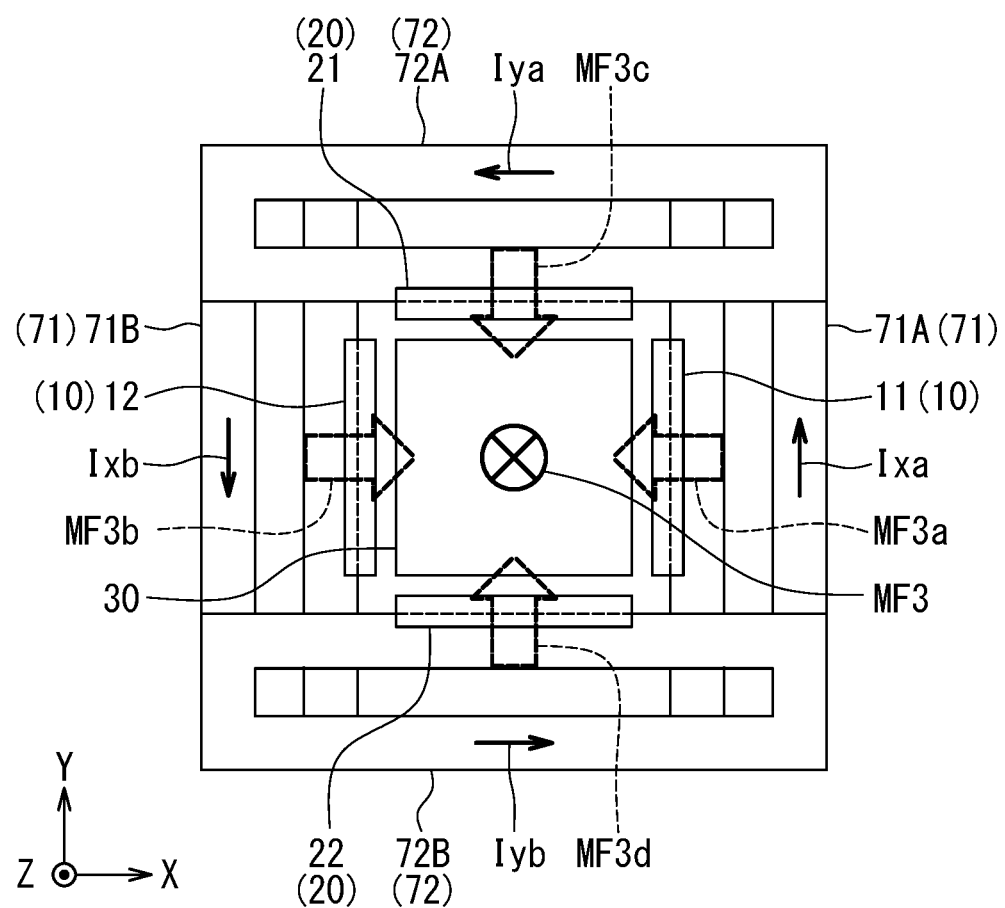
FIG. 34 is an explanatory diagram illustrating the function of the first and second magnetic field generators of a third embodiment of the invention.

Next, the third additional magnetic field of the present embodiment will be described with reference to FIG. 34. FIG. 34 is an explanatory diagram illustrating the function of the first and second magnetic field generators 71 and 72. In the present embodiment, the first and second coils 71A and 71B of the first magnetic field generator 71 and the third and fourth coils 72A and 72B of the second magnetic field generator 72 cooperate to generate the third additional magnetic field. When the third additional magnetic field is generated by the first to fourth coils 71A, 71B, 72A and 72B, the third magnetic sensor 30 is subjected to a third additional magnetic field component.

The direction of the third additional magnetic field component is controlled by the current Ixa passed through the first coil 71A, the current Ixb passed through the second coil 71B, the current Iya passed through the third coil 72A, and the current Iyb passed through the fourth coil 72B. To subject the third magnetic sensor 30 to the third additional magnetic field component in the Z direction of the reference coordinate system, the directions of the currents Ixa, Ixb, Iya, and Iyb are each set to be clockwise as viewed from above. To subject the third magnetic sensor 30 to the third additional magnetic field component in the −Z direction of the reference coordinate system, the directions of the currents Ixa, Ixb, Iya, and Iyb are each set to be counterclockwise as viewed from above. The currents Ixa, Ixb, Iya, and Iyb are equal or almost equal in magnitude. The currents Ixa and Ixb and the currents Iya and Iyb may be alternately passed at predetermined intervals.

FIG. 34 shows the directions of the currents Ixa, Ixb, Iya, and Iyb in the case of subjecting the third magnetic sensor 30 to the third additional magnetic field component in the −Z direction of the reference coordinate system. In FIG. 34, the mark designated by the reference symbol MF3 indicates the direction of the third additional magnetic field component that the third magnetic sensor 30 is subjected to.

When the third magnetic sensor 30 is subjected to the third additional magnetic field component, the first and second magnetic sensors 10 and 20 are also subjected to part of the third additional magnetic field. FIG. 34 shows components MF3$a$, MF3$b$, MF3$c$, and MF3$d$ of the third additional magnetic field that are in directions parallel to the XY plane of the reference coordinate system when the third magnetic sensor 30 is subjected to the third additional magnetic field component in the −Z direction of the reference coordinate system. The component MF3$a$ is a component that the first portion 11 of the first magnetic sensor 10 is subjected to. The component MF3$b$ is a component that the second portion 12 of the first magnetic sensor 10 is subjected to. The component MF3$c$ is a component that the first portion 21 of the second magnetic sensor 20 is subjected to. The component MF3$d$ is a component that the second portion 22 of the second magnetic sensor 20 is subjected to.

In the present embodiment, it is possible to apply the third additional magnetic field component to the third magnetic sensor 30 without providing the third magnetic field generator 73. The present embodiment thus reduces the dimension of the composite chip component 3 (see, for example, FIG. 1) in the Z direction.

The configuration, function and effects of the present embodiment are otherwise the same as those of the first embodiment.

The present invention is not limited to the foregoing embodiments, and various modifications may be made thereto. For example, the configurations of the first to third magnetic sensors 10, 20 and 30 and those of the first to third magnetic field generators 71, 72 and 73 are not limited to the respective examples illustrated in the foregoing embodiments, and can be freely chosen as long as the requirements of the claims are met.

The magnetic sensor device of the present invention may be provided with only one or two of the magnetic sensors 10, 20 and 30. When the magnetic sensor device is provided with only a single magnetic sensor, the magnetic sensor corresponds to the first magnetic sensor of the present invention. When the magnetic sensor device is provided with two magnetic sensors, the two magnetic sensors correspond to the first and second magnetic sensors of the present invention.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor device comprising:
   a first magnetic sensor for detecting a first external magnetic field component, the first external magnetic field component being a component of an external magnetic field and being in a first sensing direction;
   a support;
   a first magnetic field generator capable of generating a first additional magnetic field; and
   a second magnetic field generator capable of generating a second additional magnetic field, wherein
   the first magnetic sensor, the support, the first magnetic field generator, and the second magnetic field generator are integrated,
   the support has an outer surface including a reference plane,
   the first magnetic sensor is mounted on the reference plane,
   the first magnetic sensor is configured to be subjected to a first additional magnetic field component of the first additional magnetic field and a second additional magnetic field component of the second additional magnetic field respectively when the first additional magnetic field is generated by the first magnetic field generator and when the second additional magnetic field is generated by the second magnetic field generator;
   the first additional magnetic field component is a component of the first additional magnetic field and is in a direction parallel to a first direction,
   the second additional magnetic field component is a component of the second additional magnetic field and is in a direction parallel to a second direction, and
   the first direction and the second direction are mutually different directions in the reference plane.

2. The magnetic sensor device according to claim 1, wherein the first and second magnetic field generators are included in the support.

3. The magnetic sensor device according to claim 1, wherein the first sensing direction is parallel to the reference plane.

4. The magnetic sensor device according to claim 1, wherein
   the first magnetic field generator includes a first coil and a second coil located at mutually different positions, and
   the second magnetic field generator includes a third coil and a fourth coil located at mutually different positions.

5. The magnetic sensor device according to claim 1, further comprising a second magnetic sensor for detecting a second external magnetic field component, the second external magnetic field component being a component of the external magnetic field and being in a second sensing direction, wherein
the second magnetic sensor is mounted on the reference plane, and
the second magnetic sensor is configured to be subjected to the first additional magnetic field component and the second additional magnetic field component respectively when the first additional magnetic field is generated by the first magnetic field generator and when the second additional magnetic field is generated by the second magnetic field generator.

6. The magnetic sensor device according to claim 5, wherein both the first sensing direction and the second sensing direction are parallel to the reference plane.

7. The magnetic sensor device according to claim 5, wherein
the first magnetic field generator includes a first coil and a second coil located at mutually difference positions, and
the second magnetic field generator includes a third coil and a fourth coil located at mutually different positions.

8. The magnetic sensor device according to claim 5, further comprising a third magnetic sensor for detecting a third external magnetic field component, the third external magnetic field component being a component of the external magnetic field and being in a third sensing direction, wherein
the third magnetic sensor is mounted on the reference plane, and
the third magnetic sensor is configured to be subjected to the first additional magnetic field component and the second additional magnetic field component respectively when the first additional magnetic field is generated by the first magnetic field generator and when the second additional magnetic field is generated by the second magnetic field generator.

9. The magnetic sensor device according to claim 8, wherein both the first sensing direction and the second sensing direction are parallel to the reference plane.

10. The magnetic sensor device according to claim 9, wherein the third sensing direction is perpendicular to the reference plane.

11. The magnetic sensor device according to claim 8, wherein
the first magnetic field generator includes a first coil and a second coil located at mutually difference positions, and
the second magnetic field generator includes a third coil and a fourth coil located at mutually different positions.

12. The magnetic sensor device according to claim 11, wherein
the first to fourth coils are capable of generating a third additional magnetic field in cooperation with each other, the third magnetic sensor is configured to be subjected to a third additional magnetic field component when the third additional magnetic field is generated by the first to fourth coils, the third additional magnetic field component being a component of the third additional magnetic field and being in a direction parallel to a third direction, and
the third direction is perpendicular to the reference plane.

13. The magnetic sensor device according to claim 8, further comprising a third magnetic field generator that is integrated with the support and capable of generating a third additional magnetic field, wherein
the third magnetic sensor is configured to be subjected to a third additional magnetic field component when the third additional magnetic field is generated by the third magnetic field generator, the third additional magnetic field component being a component of the third additional magnetic field and being in a direction parallel to a third direction, and
the third direction is perpendicular to the reference plane.

14. The magnetic sensor device according to claim 13, wherein the third magnetic field generator is included in the support.

15. The magnetic sensor device according to claim 13, wherein the first and second magnetic sensors are each configured to be subjected to the third additional magnetic field component when the third additional magnetic field is generated by the third magnetic field generator.

16. The magnetic sensor device according to claim 8, wherein
the reference plane includes a first area, a second area, and a third area different from each other,
the first area is an area formed by vertically projecting the first magnetic sensor onto the reference plane,
the second area is an area formed by vertically projecting the second magnetic sensor onto the reference plane,
the third area is an area formed by vertically projecting the third magnetic sensor onto the reference plane, and
at least part of the first area is located to be intersected by a first straight line, and at least part of the second area is located to be intersected by a second straight line, the first straight line and the second straight line being two mutually orthogonal straight lines that pass through a centroid of the third area and are perpendicular to a third direction, the third direction being perpendicular to the reference plane.

17. The magnetic sensor device according to claim 16, wherein no portion of the first area is intersected by the second straight line, and no portion of the second area is intersected by the first straight line.

18. The magnetic sensor device according to claim 16, wherein the first area includes a first partial area and a second partial area located on opposite sides of the third area in a direction parallel to the first straight line, and the second area includes a third partial area and a fourth partial area located on opposite sides of the third area in a direction parallel to the second straight line.

* * * * *